US007414845B2

(12) United States Patent
Attlesey et al.

(10) Patent No.: US 7,414,845 B2
(45) Date of Patent: Aug. 19, 2008

(54) CIRCUIT BOARD ASSEMBLY FOR A LIQUID SUBMERSION COOLED ELECTRONIC DEVICE

(75) Inventors: Chad Daniel Attlesey, Rochester, MN (US); R. Daren Klum, Shoreview, MN (US); Allen James Berning, Rochester, MN (US)

(73) Assignee: Hardcore Computer, Inc., Rochester, MN (US)

( * ) Notice: Subject to any disclaimer, the term of this patent is extended or adjusted under 35 U.S.C. 154(b) by 0 days.

(21) Appl. No.: 11/736,985

(22) Filed: Apr. 18, 2007

(65) Prior Publication Data

US 2007/0268669 A1    Nov. 22, 2007

Related U.S. Application Data

(60) Provisional application No. 60/800,715, filed on May 16, 2006.

(51) Int. Cl.
*H05K 7/20* (2006.01)
*F28D 15/00* (2006.01)

(52) U.S. Cl. .................. 361/699; 361/702; 361/703; 361/704; 361/719; 165/80.4; 165/104.33; 165/908

(58) Field of Classification Search ......... 361/687–690, 361/696–699, 701; 165/80.4, 104.33, 185, 165/908
See application file for complete search history.

(56) References Cited

U.S. PATENT DOCUMENTS

| 2,440,930 | A | * | 5/1948 | Camilli et al. ................. 62/171 |
| 3,812,402 | A | | 5/1974 | Garth |
| 4,302,793 | A | | 11/1981 | Rohner |
| 4,590,538 | A | | 5/1986 | Cray, Jr. |
| 4,765,397 | A | | 8/1988 | Chrysler et al. |
| 5,021,924 | A | | 6/1991 | Kieda et al. |
| 5,107,397 | A | * | 4/1992 | Azar ........................... 361/694 |
| 5,131,233 | A | | 7/1992 | Cray et al. |
| 5,305,184 | A | * | 4/1994 | Andresen et al. ............ 361/699 |
| 5,448,108 | A | | 9/1995 | Quon et al. |

(Continued)

FOREIGN PATENT DOCUMENTS

JP    2004-84958 A    3/2004

OTHER PUBLICATIONS

Article printed from http://www.tomhardware.com/2006/01/09/strip_out_the_fans/, Strip Out the Fans, Add 8 Gallons of Cooking Oil.*

(Continued)

*Primary Examiner*—Jayprakash N Gandhi
*Assistant Examiner*—Robert J Hoffberg
(74) *Attorney, Agent, or Firm*—Hamre, Schumann, Mueller & Larson, P.C.

(57) ABSTRACT

A circuit board assembly, for example, a computer motherboard, for use in a liquid submersion cooled electronic device, for example, a computer, is configured to facilitate movement of the cooling liquid when the circuit board is submerged in the cooling liquid, thereby improving the heat transfer from heat-generating components on the circuit board. For a computer, a plurality of heat-generating components are mounted on the motherboard, including a plurality of processors, a plurality of memory cards, a plurality of graphics cards, and a plurality of power supplies. A pump for the cooling liquid can also be mounted on the motherboard.

7 Claims, 21 Drawing Sheets

U.S. PATENT DOCUMENTS

| | | | |
|---|---|---|---|
| 5,731,954 A | | 3/1998 | Cheon |
| 5,796,583 A | * | 8/1998 | Gale et al. .................. 361/704 |
| 5,943,211 A | | 8/1999 | Havey et al. |
| 6,019,167 A | * | 2/2000 | Bishop et al. .......... 165/104.33 |
| 6,052,284 A | * | 4/2000 | Suga et al. .................. 361/699 |
| 6,234,240 B1 | | 5/2001 | Cheon |
| 6,262,890 B1 | * | 7/2001 | Dhawan et al. ............. 361/690 |
| 6,313,990 B1 | | 11/2001 | Cheon |
| 6,333,849 B1 | | 12/2001 | Donahoe et al. |
| 6,450,832 B1 | * | 9/2002 | Aguilar et al. .............. 439/490 |
| 6,664,627 B2 | | 12/2003 | Cheon |
| 6,938,678 B1 | | 9/2005 | Bortolini et al. |
| 6,979,772 B2 | * | 12/2005 | Meng-Cheng et al. .. 174/17 VA |
| 7,054,165 B2 | * | 5/2006 | Yi-Lung ..................... 361/810 |
| 7,233,501 B1 | * | 6/2007 | Ingalz ........................ 361/760 |
| 7,295,436 B2 | * | 11/2007 | Cheon ........................ 361/699 |
| 2003/0081380 A1 | | 5/2003 | Nakagawa et al. |
| 2006/0012959 A1 | | 1/2006 | Lee et al. |
| 2006/0037739 A1 | | 2/2006 | Utsunomiya |
| 2007/0025081 A1 | * | 2/2007 | Berlin et al. ................ 361/698 |
| 2007/0034360 A1 | * | 2/2007 | Hall ...................... 165/104.33 |
| 2007/0227710 A1 | | 10/2007 | Belady et al. |

OTHER PUBLICATIONS

Article printed from http://pugetsystems.com/submerged.php, "Mineral Oil Submerged Computer".*

Anderson et al, Subcooled Flow Boiling Scheme for Direct Immersion Cooling or Three-Dimensional Electronic Packages in Large-Scale Computers or Supercomputers, IBM Technical Disclosure, No. 11, Apr. 1991, pp. 387-390.*

Feurstein et al, Immersion Forced Cooling of High-Powered Chips, IBM Technical Discloure Bulletin, Jan. 1985, pp. 4805-4806.*

"Koolance Superior Liquid Cooling Systems", PSU-1200ATX-12S User Manual, English v1.01, pp. 1-10.

Images printed from http://www.koolance.com/shop/images/more/psu-1200atx-12s, Apr. 3, 2007, pp. 1-3.

Diagrams printed from http://www.koolance.com/shop/diagrams/more/psu-1200atx-12s, Apr. 3, 2007, pp. 1-4.

"Koolance 1200W Liquid-Cooled Power Supply", article printed from http://www.koolance.com/shop/product_info.php?cPath=28_73&products_id=387, Apr. 3, 2007, pp. 1-3.

http://www.tomshardware.com, "Tom's Hardware—Computer Hardware News, Tests, Ratings and Reviews", Aug. 21, 2007, pp. 1-2.

Article printed from http://www.tomshardware.com/2006/01/09/strip_out_the_fans/, "Strip Out The Fans, Add 8 Gallons of Cooking Oil / Tom's Hardware", Aug. 1, 2007, pp. 1-30.

http://www.pugetsystems.com/ "Puget Custom Computer—Desktop Computers, Laptops, Servers", Aug. 21, 2007, 1 page.

Article printed from http://www.pugetsystems.com/submerged.php, "Mineral Oil Submerged Computer", Aug. 1, 2007, pp. 1-7.

Specification for co-pending U.S. Appl. No. 11/736,947, filed Apr. 18, 2007.

Specification for co-pending U.S. Appl. No. 11/736,965, filed Apr. 18, 2007.

International Search Report of International Application No. PCT/US2007/068864.

Written Opinion of the International Searching Authority of International Application No. PCT/US2007/068864.

* cited by examiner

FIG. 1 - PRIOR ART

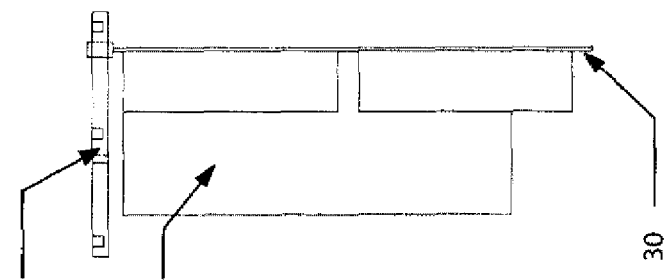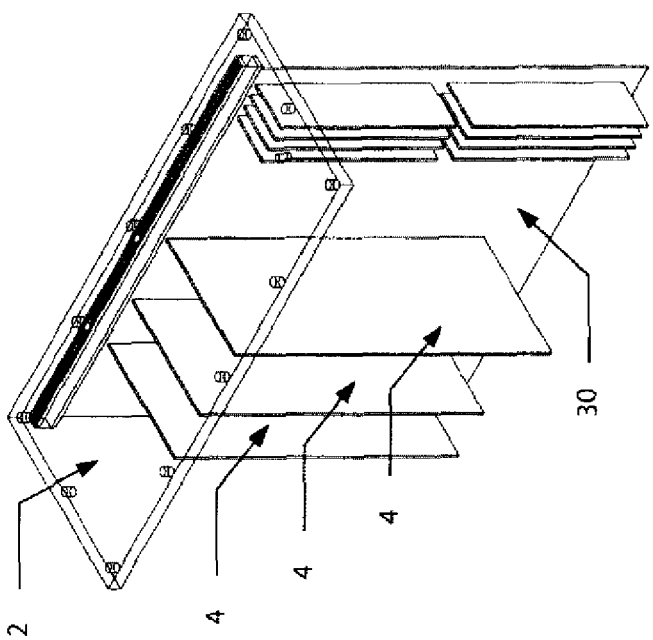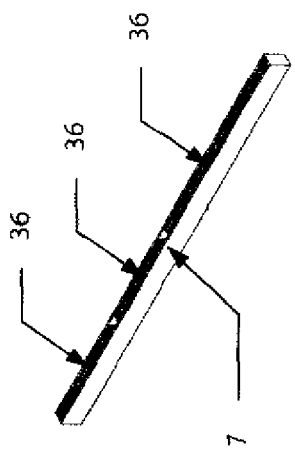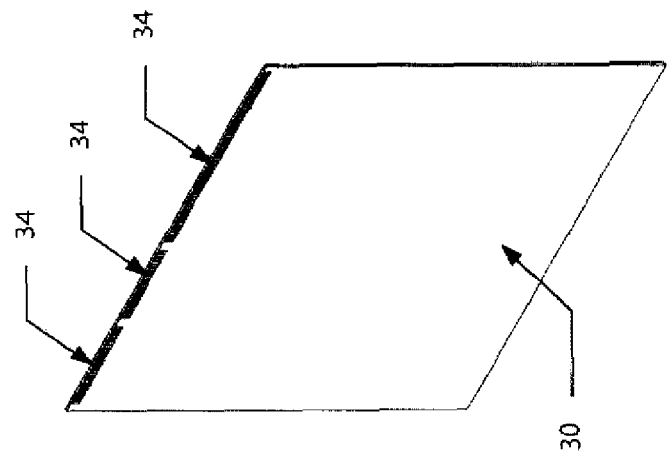

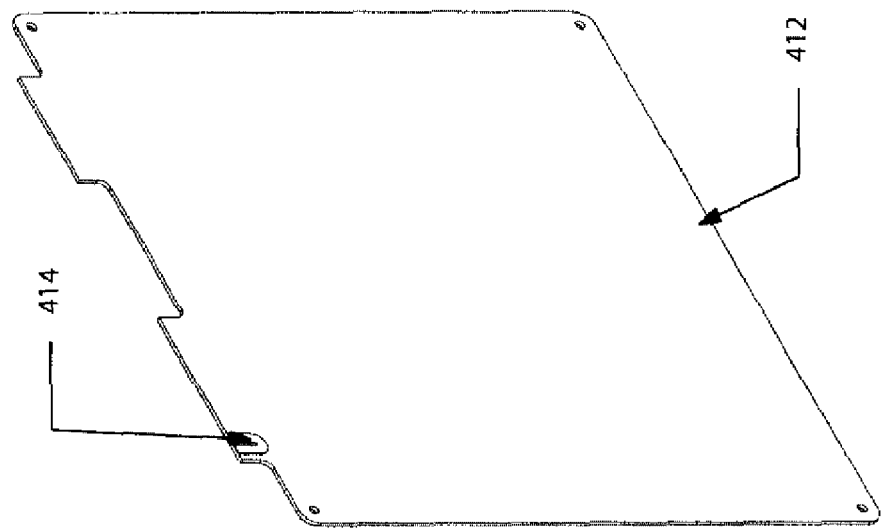
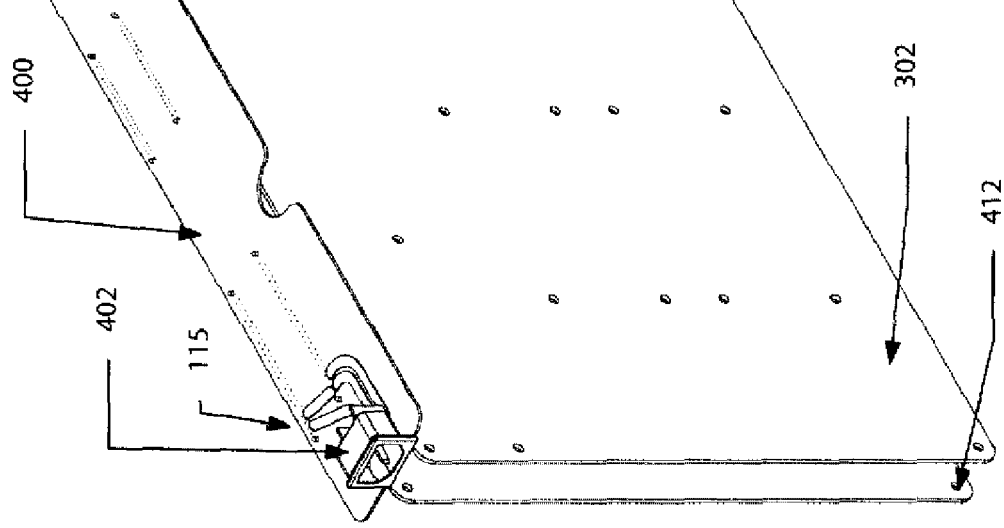
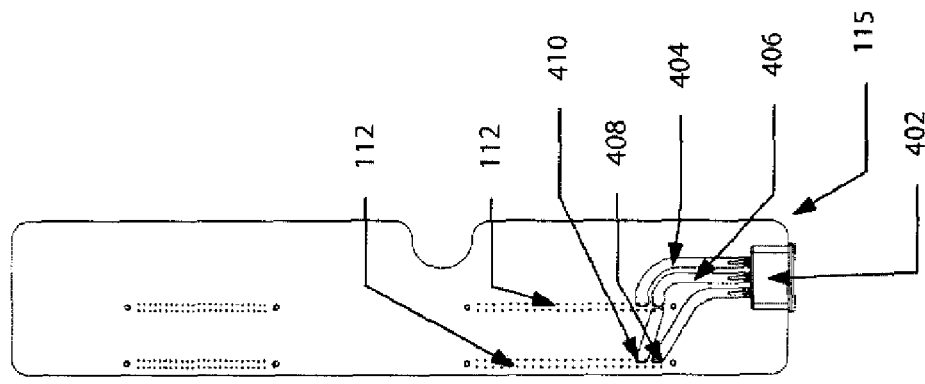

CIRCUIT BOARD ASSEMBLY FOR A LIQUID SUBMERSION COOLED ELECTRONIC DEVICE

This application claims the benefit of U.S. Provisional Application 60/800,715 filed May 16, 2006, which is incorporated by reference herein in its entirety.

TECHNICAL FIELD

This disclosure relates to a liquid submersion cooling system, and in particular, to a circuit board assembly used in a liquid submersion cooled electronic device, for example, a computer.

BACKGROUND

A significant problem facing the computer industry is heat. The higher the temperature a component operates at, the more likely it is to fail. Also, high temperatures, while not causing catastrophic failures, can create data processing errors. Operation at high temperatures can cause power fluctuations that lead to these errors within a central processing unit (CPU) or on the motherboard anywhere that data management is handled. Despite efforts at reducing waste heat while increasing processing power, each new CPU and graphics processing unit (GPU) released on the market runs hotter than the last. Power supply and motherboard components required to provide power and handle signal processing also are producing more and more heat with every new generation.

The use of liquids in cooling systems to cool computer systems is known. One known method of cooling computer components employs a closed-loop, 2-phase system 10 as illustrated in FIG. 1. The 2-phase system 10 is employed to passively cool the north 12 and south 14 bridge chips. The vapor travels through a tube 16 to a cooling chamber 18, the vapor turns back into liquid, and the liquid is returned by tube 20 to the chips 12, 14 for further cooling. In another known liquid cooling system, internal pumps move liquid past a hot plate on a CPU and then the heated liquid is pumped into a finned lower that passively cools the liquid and returns it to the plate.

In the case of large-scale, fixed-installation supercomputers, it is known to submerge the active processing components of the supercomputer in inert, dielectric fluid. The fluid is typically allowed to flow through the active components and then it is pumped to external heat exchangers where the fluid is cooled before being returned to the main chamber.

Despite prior attempts to cool computer components, further improvements to cooling systems are necessary.

SUMMARY

A portable, self-contained liquid submersion cooling system is described that is suitable for cooling a number of electronic devices, including cooling heat-generating components in computer systems and other systems that use electronic, heat-generating components. Examples of electronic devices to which the concepts described herein can be applied include, but are not limited to, desktop computers and other forms of personal computers including laptop computers, console gaming devices, hand-held devices such as tablet computers and personal digital assistants (PDAs); servers including blade servers; disk arrays/storage systems; storage area networks; storage communication systems; work stations; routers; telecommunication infrastructure/switches; wired, optical and wireless communication devices; cell processor devices; printers; power supplies; displays; optical devices; instrumentation systems, including hand-held systems; military electronics; etc.

The electronic device can include a housing having an interior space. A dielectric cooling liquid is contained in the interior space, and a circuit board assembly is disposed within the space and submerged in the dielectric cooling liquid. The circuit board assembly includes a circuit board, and a plurality of components mounted on the circuit board. The components mounted on the circuit board can include one or more of a plurality of processors, a plurality of memory cards, a plurality of graphics card, and a plurality of power supplies. In certain embodiments, a liquid pump can also be mounted on the circuit board. Other components could be mounted on the circuit board as well, for example, light-emitting diodes and one or more hard drives.

When the electronic device is a computer, for example, a personal computer, the circuit board is a computer motherboard. The components on the motherboard are arranged on the motherboard relative to each other so as to facilitate the movement of the liquid within the housing, thereby increasing heat transfer. In particular, the components are arranged to define a first plurality of liquid flow channels parallel to an axis of the motherboard and a second plurality of liquid flow channels perpendicular to the axis.

In certain embodiments, one or more heat sinks can be connected to the heat-generating components on the circuit board. The heat sinks help mitigate heat and are designed to facilitate the flow of the liquid in the housing.

BRIEF DESCRIPTION OF THE DRAWINGS

FIG. 6 is a detailed illustration of the pass-through connector.

FIG. 7 is a perspective view of the motherboard or circuit board of the computer.

FIGS. 8A and 8B are perspective and side views, respectively, showing daughter cards on the motherboard and showing engagement with the lid.

FIGS. 31A, 31B and 31C illustrate details of the AC current cut-off mechanism associated with the lid.

DETAILED DESCRIPTION

A liquid submersion cooling system is described that is suitable for cooling a number of electronic devices, including cooling heat-generating components in computer systems and other systems that use electronic, heat-generating components. In the case of computer systems, the liquid submersion cooling system permits creation of, for example, desktop-sized computers with scalable architectures where it is possible to produce 32 to 64, or more, processor core systems (8 sockets×8 cores=64 processor). The processing power of these desktop-sized computer systems will rival or surpass supercomputing systems that, until now, would require significant floor space.

Examples of electronic devices to which the concepts described herein can be applied include, but are not limited to, desktop computers and other forms of personal computers including laptop computers; console gaming devices, hand-held devices such as tablet computers, wearable computers and personal digital assistants (PDAs); servers including blade servers; disk arrays/storage systems; storage area networks; storage communication systems; work stations; routers; telecommunication infrastructure/switches; wired, optical and wireless communication devices; cell processor devices; printers; power supplies; displays; optical devices; instrumentation systems including hand-held systems; military electronics; etc. The concepts will be described and illustrated herein as applied to a desktop-sized computer. However, it is to be realized that the concepts could be used on other electronic devices as well.

Figure 1:
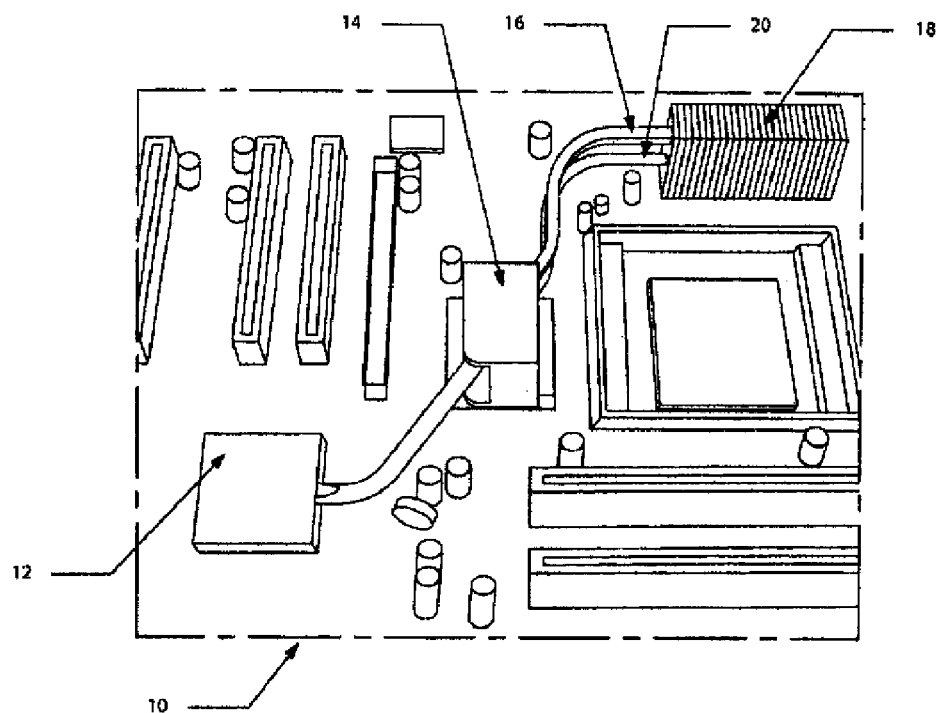
FIG. 1 shows a cooling system employing a 2-phase system 10 to passively cool the north and south bridge chips.
Figure 2:
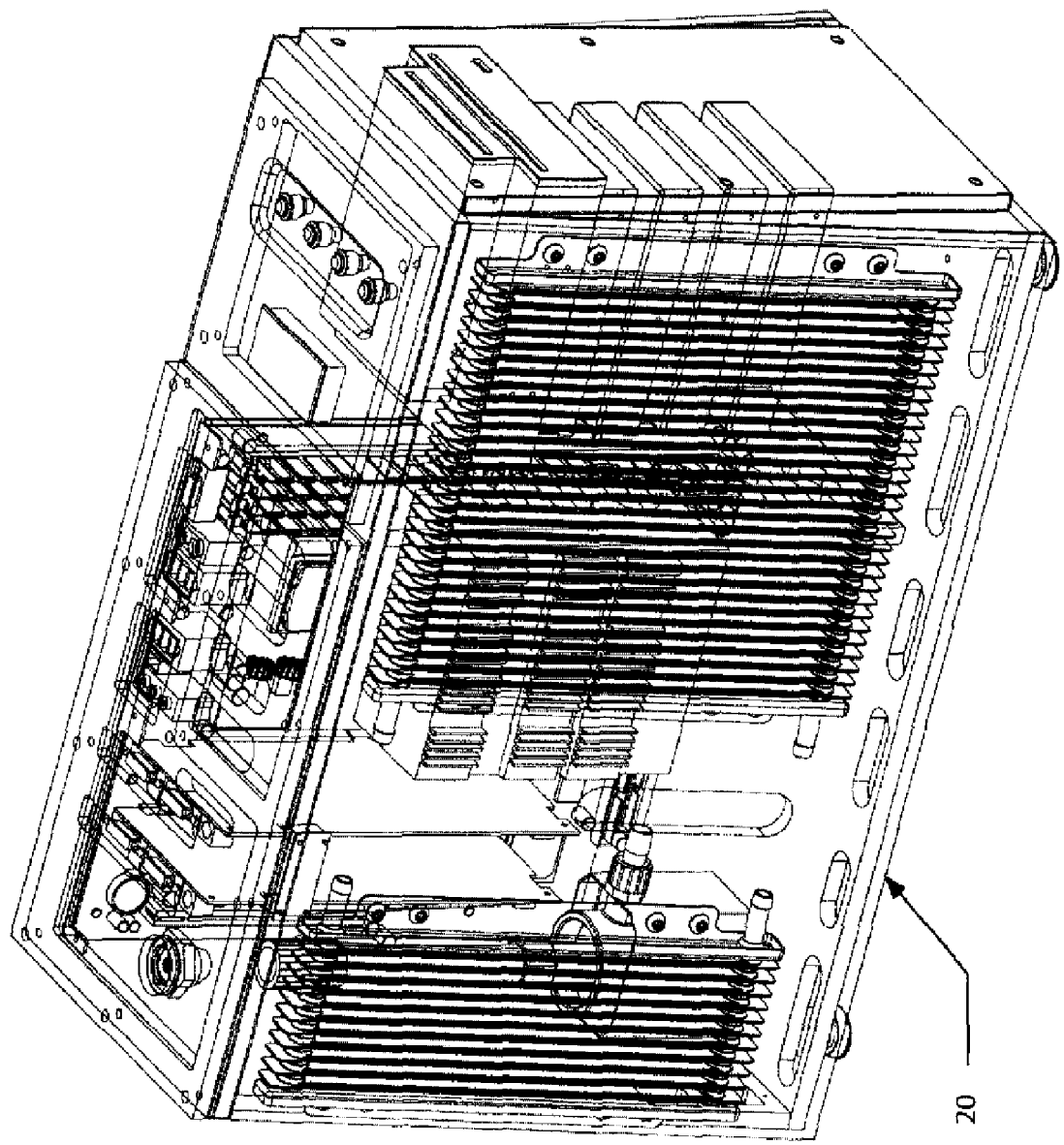
FIG. 2 is a view of an embodiment of a liquid submersion cooling system on a personal computer.
Figure 3B:
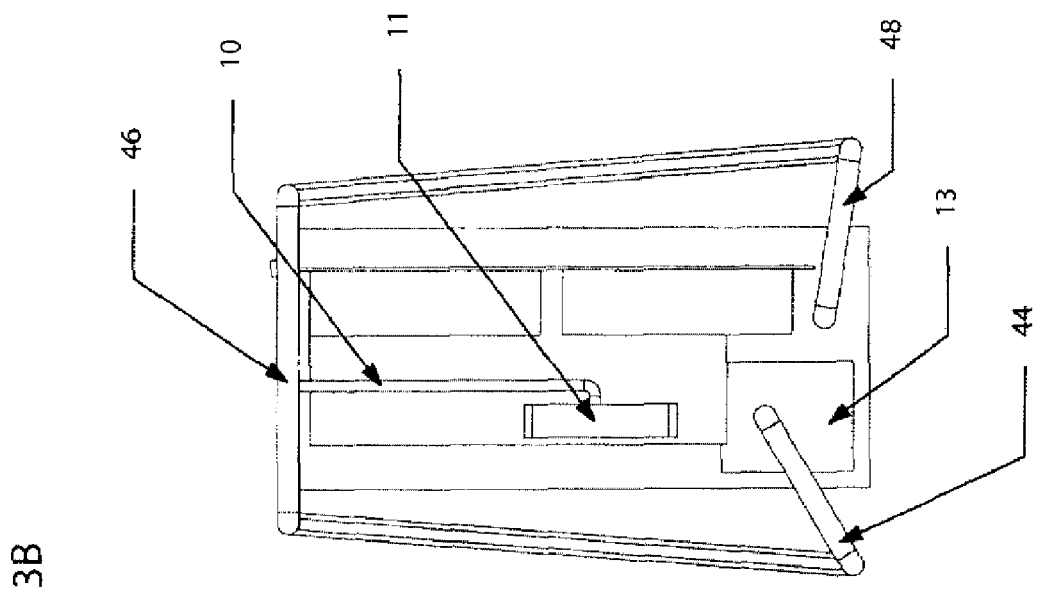
FIGS. 3A and 3B are perspective and end views, respectively, showing components of the liquid submersion cooling system of FIG. 2.
Figure 3A:
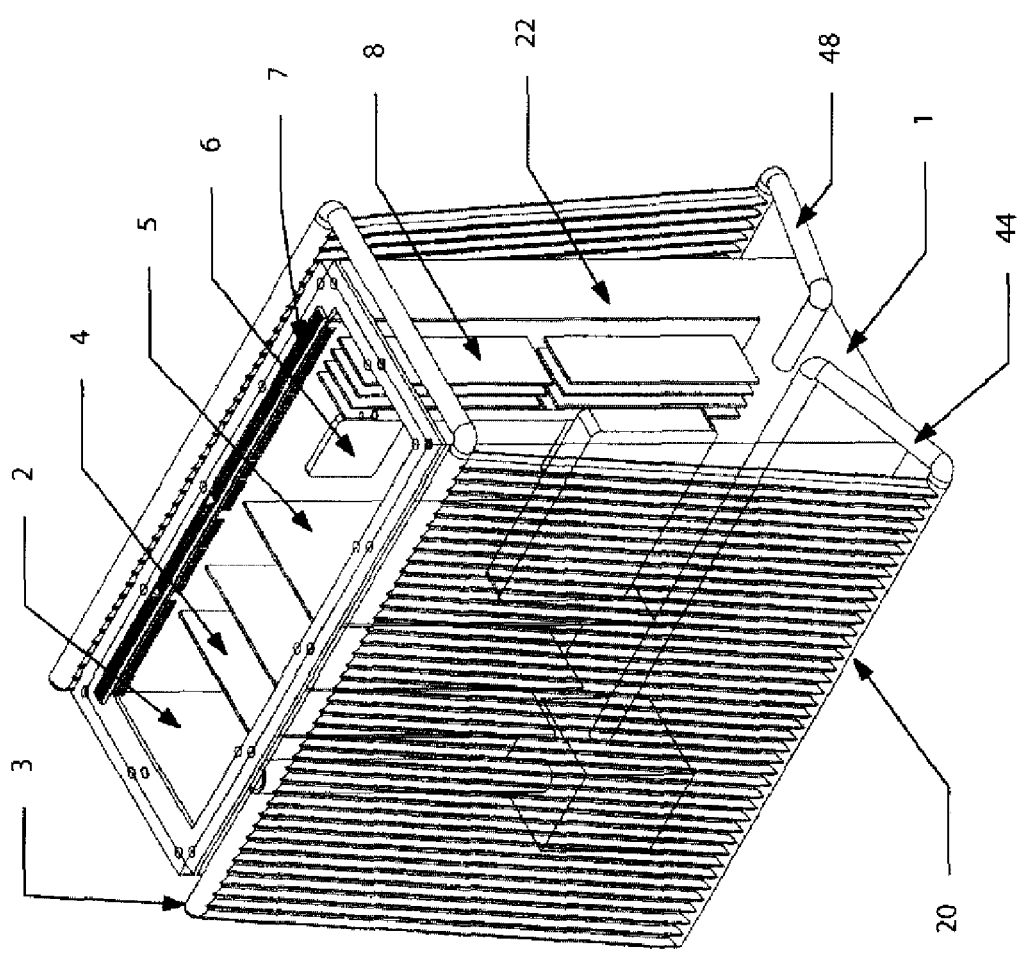
Figure 5A:
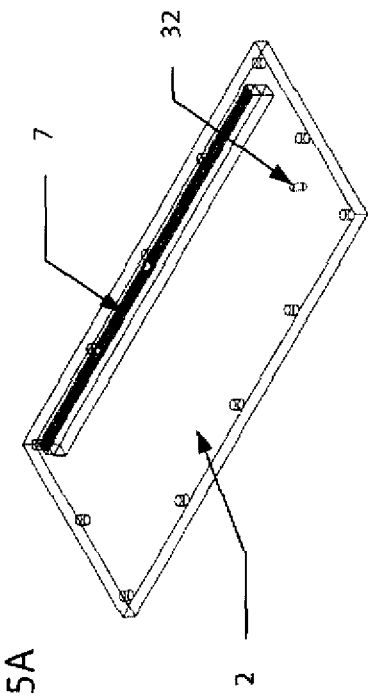
FIGS. 5A, 5B, and 5C are perspective, top and side views, respectively, of the lid of the computer case showing the pass-through connector.
Figure 5B:
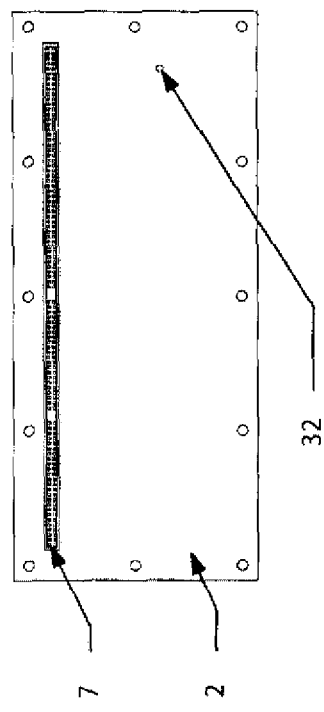
Figure 5C:
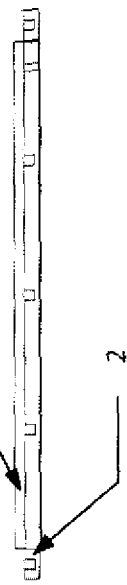
Figure 4:
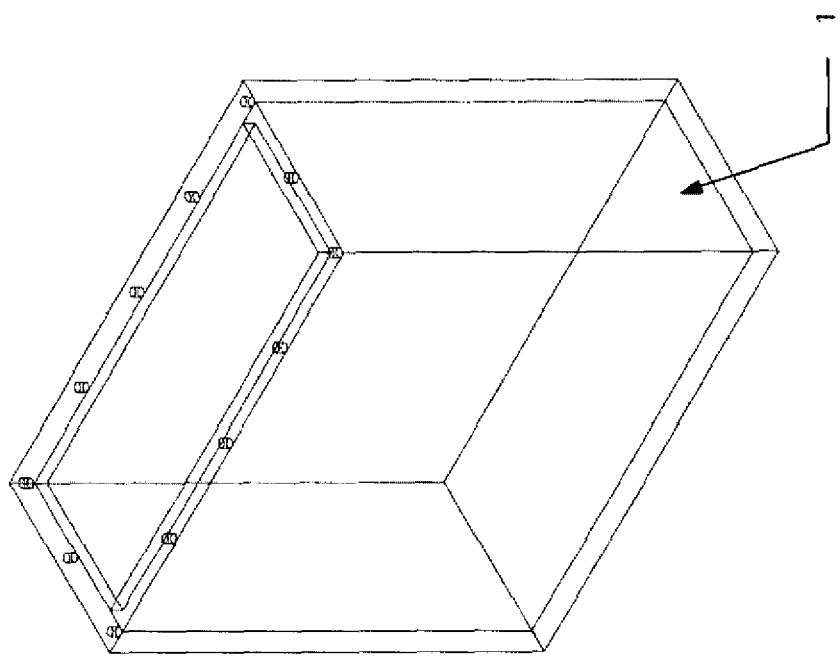
FIG. 4 is a perspective view of the computer case.

FIGS. 2, 3A and 3B illustrate one embodiment of a desktop-sized computer 20 employing a liquid submersion cooling system 22. All active components are illustrated submerged in a tank of dielectric liquid. This system uses a dielectric cooling liquid in direct contact with the electronically and thermally active components of a computer system. Dielectric liquids that can be used in this type of immersive cooling system include, but are not limited to:

Engineered fluids like 3M™ Novec™
Mineral oil
Silicone oil
Natural ester-based oils, including soybean-based oils
Synthetic ester-based oils Many of these dielectric fluids also have the ability to extinguish fires on computer components. By submerging computer components in a dielectric, fire-retardant fluid, the chance of a fire starting due to computer component failure is minimized.

Initial testing has involved the dielectric liquid 3M™ Novec™. However, other dielectric liquids, like mineral oil and ester-based oils, may be used. Other dielectric liquids that have a higher boiling temperature along with greater thermal transfer capability can be employed. These cooling liquids need not change state if they have a high enough thermal transfer capability to handle the amount of heat being generated by components contained in the system.

The lid 2 of the case 1 will attach to the connector side of the computer motherboard 30, shown in FIGS. 7, 8A and 8B, allowing motherboard input/output (IO) connections, daughter card 4 IO and power to be passed in and out of the system. Components such as daughter cards 4, additional processors 6, power supply card 5, and memory cards 8 can be added to the system by opening the tank lid 2 and lifting the attached electronics out of the case 1. In addition, a hard drive 11 can be disposed in the case 1, with an air line 10 connected to the hard drive breather hole leading from the hard drive to the exterior of the case 1.

Figure 10:
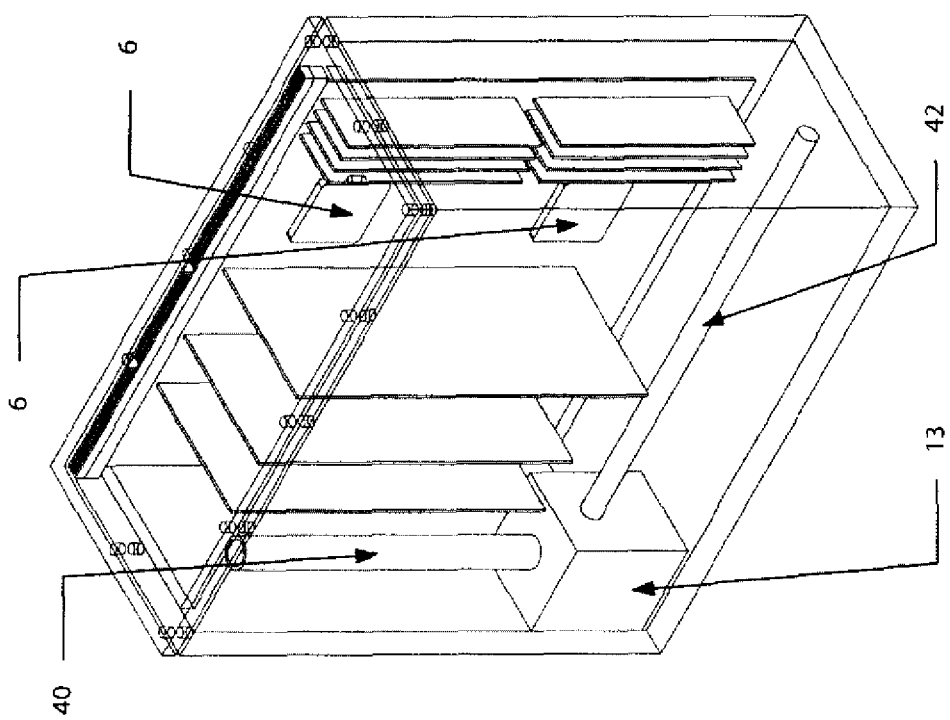
FIG. 10 illustrates the subassembly of FIG. 9 with a pump within the case.

At least one pump 13 will pump warm liquid from the top of the case 1 and pass it through surrounding heat exchangers 3. The pump 13 may be submersed in the liquid as shown in FIGS. 3B and 10, or external to the case 1. Using two external pumps 13 with quick-release hose attachments would allow hot-swapping of a failed pump while the other pump maintains system circulation. Using one external pump 13 with quick-release hose attachments would allow the change-out of a failed pump with only a brief system downtime.

The heat exchangers 3 can act as the outside surface and supporting structure of the computer case 1. The majority of the case wall may act as a radiator surface. Unlike current Advanced Technology Extended (ATX) or Balanced Technology Extended (BTX) cases that push air through fans from the front of the case to the back, the disclosed system will take cold air from the base of the case and, aided by natural convection, pull more air up as intake air is heated and rises. The walls of the heat exchangers 3 may be tapered upward, like a cooling tower on a boiler. This tapering will help accelerate convection currents, making it possible to cool the system without the use of air-moving devices, such as fans.

As shown in FIGS. 3A and 3B, the case 1 is large enough to contain all of the active computer components that require cooling. It may also be necessary to leave space for liquid return lines 48 with nozzles over critical components that require cooling. Nozzles may be incorporated to direct the flow of the return liquid at specific, high-temperature areas like the CPUs.

As shown in FIGS. 5A-C, 6 and 9, the lid 2 not only provides a liquid- and gas-tight seal for the case 1, but it also contains a pass-through connector 7 that allows external component IO, storage IO and power to pass into and out of the case 1, to and from the computer motherboard 30 and its components. The lid 2 will have a gasket that will seal the case 1. The lid 2 may also contain a fill port 32 for filling the case 1 with coolant.

As shown in FIGS. 7, 8A and 8B, the motherboard 30 is essentially functionally the same as in current ATX or BTX specification boards, with the exception being that it does not have the same IO and power connectors. Instead, the top edge of the board is lined with a series of conductive pads 34 that are contacts for engaging the pass-through connector 7 that is part of the lid 2. Multiple motherboards or other circuit boards may be employed to allow stacking of extra processors 6 or other components for additional computing power or to allow for multiple computers within a single tank enclosure. This cooling system would allow for numerous computer systems to be cooled in a single tank or individual tanks which may be interconnected to create a server or workstation rack system.

As shown in FIGS. 8A and 8B, the daughter cards 4 connect to the motherboard 30 as they do with current ATX or BTX specification boards. Daughter cards 4 can include video cards and other PCI or PCIE cards that require IO pass-through to the outside of the case 1. These daughter cards 4 will require liquid- and gas-tight gaskets in order to allow external IO connections.

Unlike ATX or BTX designs, the power supply 5 may also be a daughter card 4, with no power supply to motherboard wiring required. The power supply may also be directly integrated into the motherboard. External alternating current (AC) connections would be made through a pass-through connector into the liquid-filled tank with a liquid and gas-tight gasket.

Figure 9:
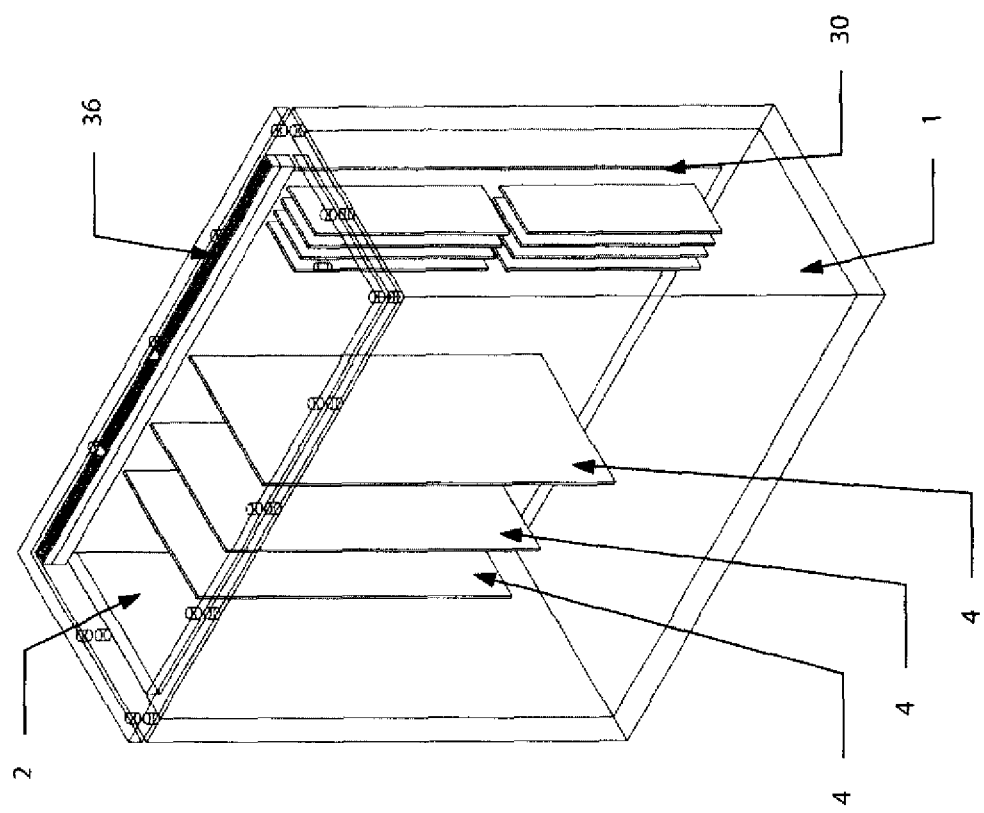
FIG. 9 illustrates a subassembly including the case, motherboard and daughter cards in the case, and the lid.

As shown in FIG. 9, the pass-through connector 7 is integrated into the lid 2 in such a way that it creates a liquid- and gas-tight electrical conduit for IO and power connectivity. It attaches to the motherboard 30 on the inside of the case 1 and leads to a connector break-out 36 on the outside of the tank 1.

The pump 13 (or pumps) is either internally-mounted within the case 1, submersed in the liquid as shown in FIG. 10, or externally mounted. The pump is used to circulate warm coolant from inside the tank 1 to outside of the tank 1 within the heat exchangers 3. Liquid may also be circulated through external hard drive cooling plates as well. The pump 13 can be wired such that it can be turned on to circulate liquid even if the computer is off. Or the pump 13 can be wired to turn on only when the computer is on. After the computer is shut off, there is more than sufficient thermal capacity in the liquid within the case 1 to remove residual heat from the submerged components. This would ensure that there is no post-shut down thermal damage. Also, if a flow sensor or pump monitor indicates that flow of coolant has stopped or has slowed below a minimum required rate, a controlled shutdown of the computer could be completed well before any damage is done to the submerged components. This embodiment avoids the possibility of a fan failure, resulting in catastrophic failure of a computer that relies on air cooling.

As shown in FIG. 10, the pump 13 is illustrated in the lower left corner of the case 1. Warm coolant is pumped from the top of the tank 1 to outside of the tank 1 into the heat exchangers 3. The pump(s) 13 may alternatively be attached to the lid 2 of the computer. This would allow for direct intake of fluids from the warmest region of the tank 1 and make maintenance and replacement of warn-out pumps much easier.

Figure 11B:
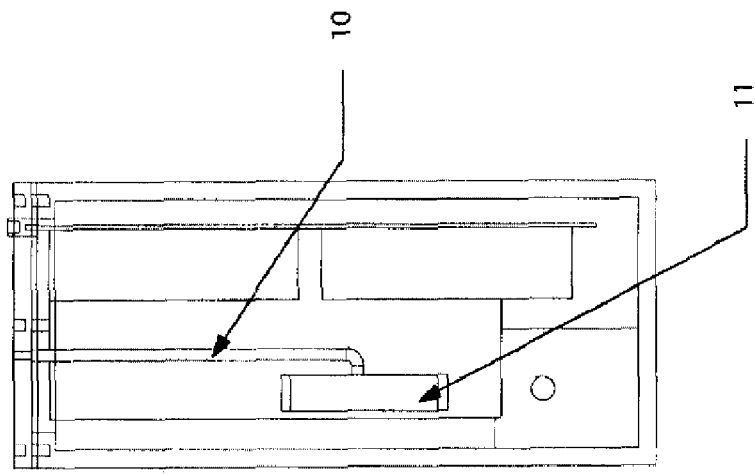
FIGS. 11A and 11B are perspective and end views, respectively, of a subassembly that includes a hard drive within the case.
Figure 11A:
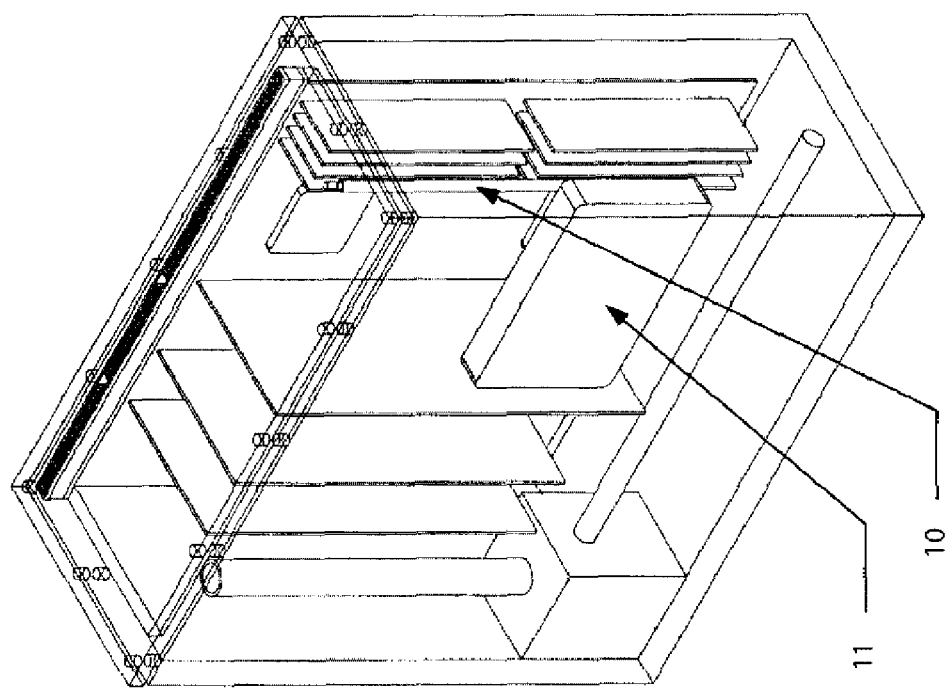

As shown in FIGS. 11A and 11B, the hard drives or other internal storage systems 11 can also be submerged. In the case of current platter-based, mechanical storage systems that require breather holes, the air line 10 could be fixed over the breather hole, allowing an open-air connection to the outside of the tank 1. The rest of the drive 11 would be sealed as to be gas and liquid impermeable.

The processors 6 mount to the motherboard 30 via normal, vender-specified sockets. Testing has shown that no heat sinks or other appliances need to be attached to the processors 6 in order to cool them sufficiently for normal, vendor-specified temperatures. However, if lower operating temperatures or a higher level of heat transfer is required for processor 6 over-clocking, heat sinks, which greatly increase the exposed surface area of heat conduction from the processor(s) 6, may be employed.

Figure 12B:
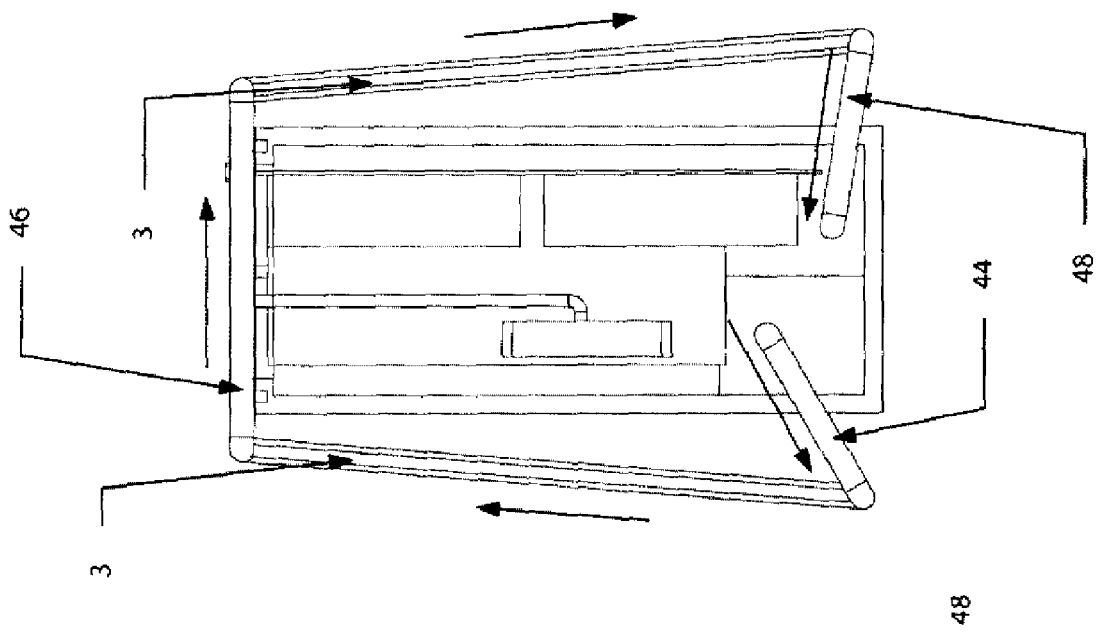
FIGS. 12A and 12B are perspective and end views, respectively, of a subassembly that includes multiple heat exchangers.
Figure 12A:
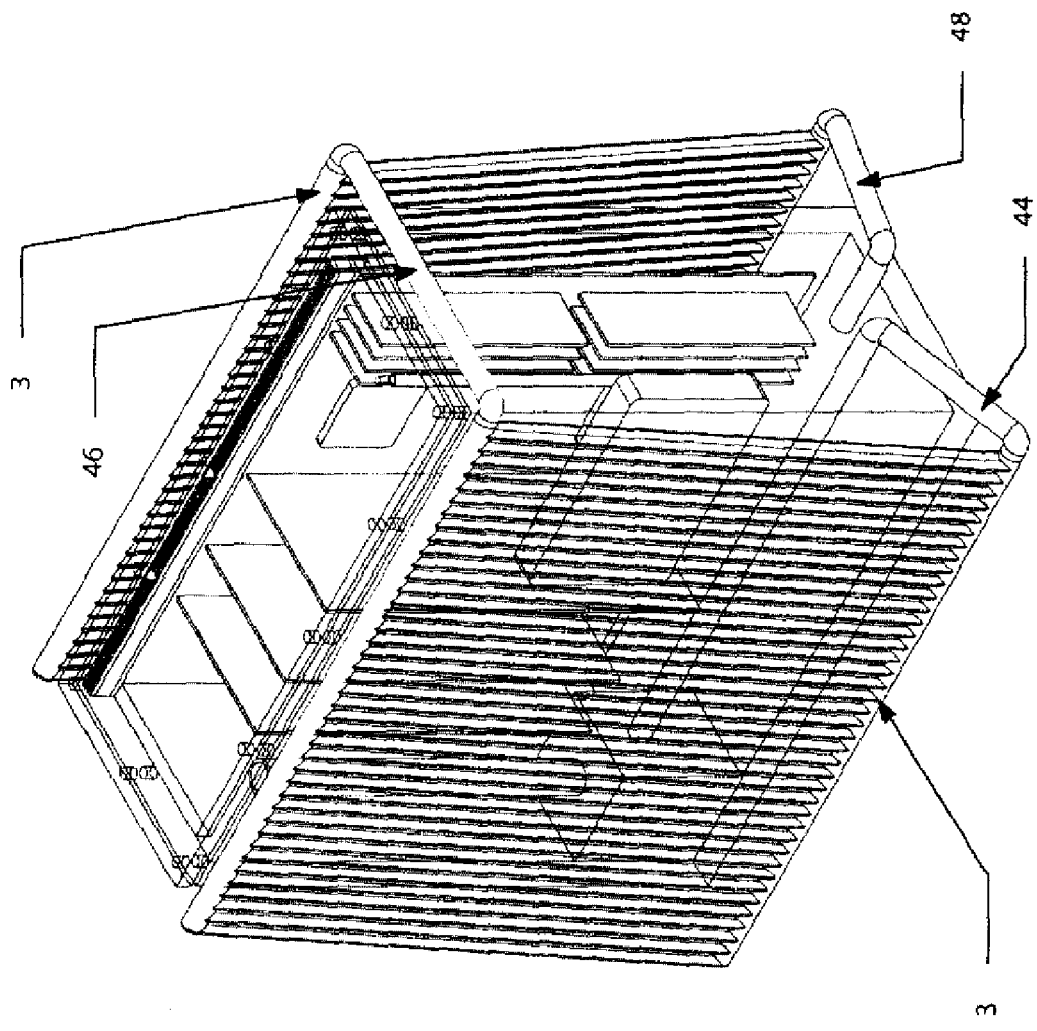

As shown in FIGS. 12A and 12B, the heat exchangers 3 or heat exchanger surfaces may serve as the external shell or case of the computer 20, When warm cooling liquid is pumped from within the case 1 to the heat exchangers 3, the liquid is cooled to ambient temperature. Cooling of liquids utilizing a heat exchanger 3 can be accomplished by one of several means:

A compressor, as is the case with typical refrigeration systems

Peltier effect cooling

Active air cooling of the radiator surface using a fan or other air-moving mechanism Passive cooling by exposing as large of a thermally conductive heat exchange surface as possible to lower ambient temperatures As shown in FIGS. 12A, 12B, 13A and 13B, the heat exchangers 3 are designed such that they angle inward and upward, creating a cooling tower effect, as seen on industrial boilers. This taper will serve to create thermal conduction that draws more cool air from near the bottom of the case 1 and allows it to migrate naturally upward and out of the top of the heat exchangers 3. Cool-air inlet ports (not shown) at the base of the heat exchangers can be covered with filter material in order to keep dust and other foreign matter out of the heat exchangers, while allowing air to enter. A fan or multiple fans may be used to aid in the upward flow of air through the cooling system.

As the cooled liquid is pumped back into the case 1, it may be sent through tubes or other deflection/routing means to injector head assemblies that serve to accelerate coolant across the most thermally active components. This accelerated liquid would help to create turbulent flow of coolant across the heated surface. This turbulent flow would break down natural laminate flow, which is poor at conducting heat through a liquid because only the first few molecules of liquid that are in contact with the heated surface can actually take heat energy away from the heated surface.

The computer 20 can also include external, removable storage drives such as CD, DVD, floppy and flash drives (not illustrated). In addition, external IO, power button and other human interface controls (not shown) would attach to the pass-through connector 7 and be mounted on a rigid circuit board or flex circuit.

FIG. 12B illustrates one possible flow path of liquid through the multiple heat exchangers 3:

1. Liquid is pumped out of the case 1 from the warm upper area of the case 1 by the pump 13 through an inlet pipe 40 and out a discharge pipe 42 (see FIG. 10); the discharge pipe 42 is connected to an inlet 44 of the heat exchanger 3.
2. Liquid flows through and is cooled by the heat exchanger 3 that is also one side wall of the computer case.
3. A connection 46 allows liquid to pass through from the heat exchanger 3 on one side of the case 1 to the heat exchanger 3 on the other side of the computer case 1.
4. Coolant flows through the heat exchanger 3 on the other side of the case 1.
5. Cooling liquid flows from the heat exchanger through a passageway 48 back into the case 1 near the bottom thereof where it is warmed by the heat-generating electronics and components and rises back to the top of the case 1 and the cycle begins again.

Figure 13B:
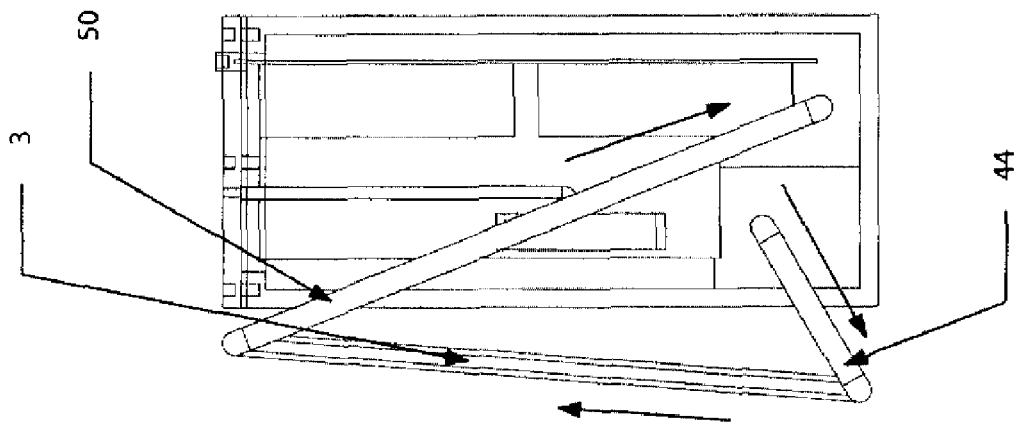
FIGS. 13A and 13B are perspective and end views, respectively, of a subassembly that includes a single heat exchanger.
Figure 13A:
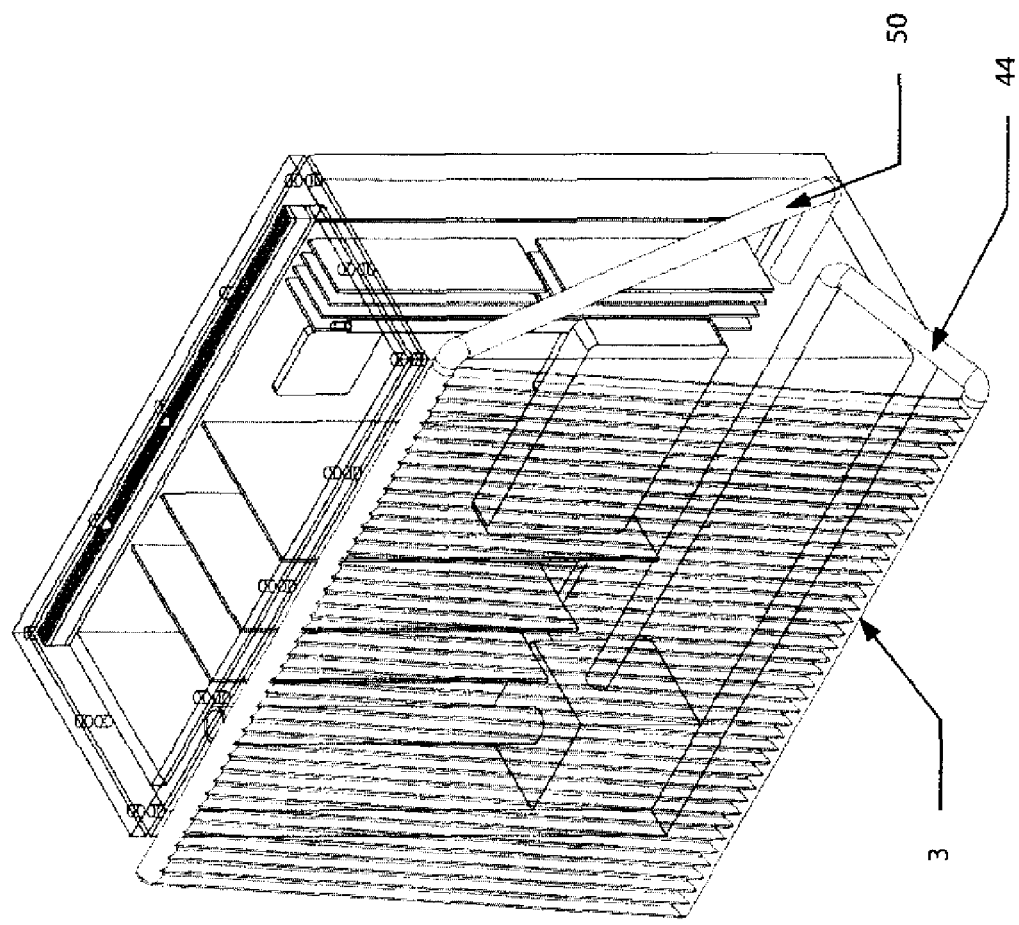

Alternatively, a single heat exchanger 3 as shown in FIGS. 13A and 13B can be used in the cooling system through the following steps.

1. Liquid is pumped out of the case 1 from the warm upper area of the tank as in the embodiment in FIG. 12B.
2. Liquid flows through and is cooled by the heat exchanger 3 that is on one side wall of the computer case 1.
3. Cooling liquid flows back to the bottom area of the tank 1 through a passageway 50 where it is warmed and rises back to the top of the case 1, and the cycle begins again.

Figure 14:
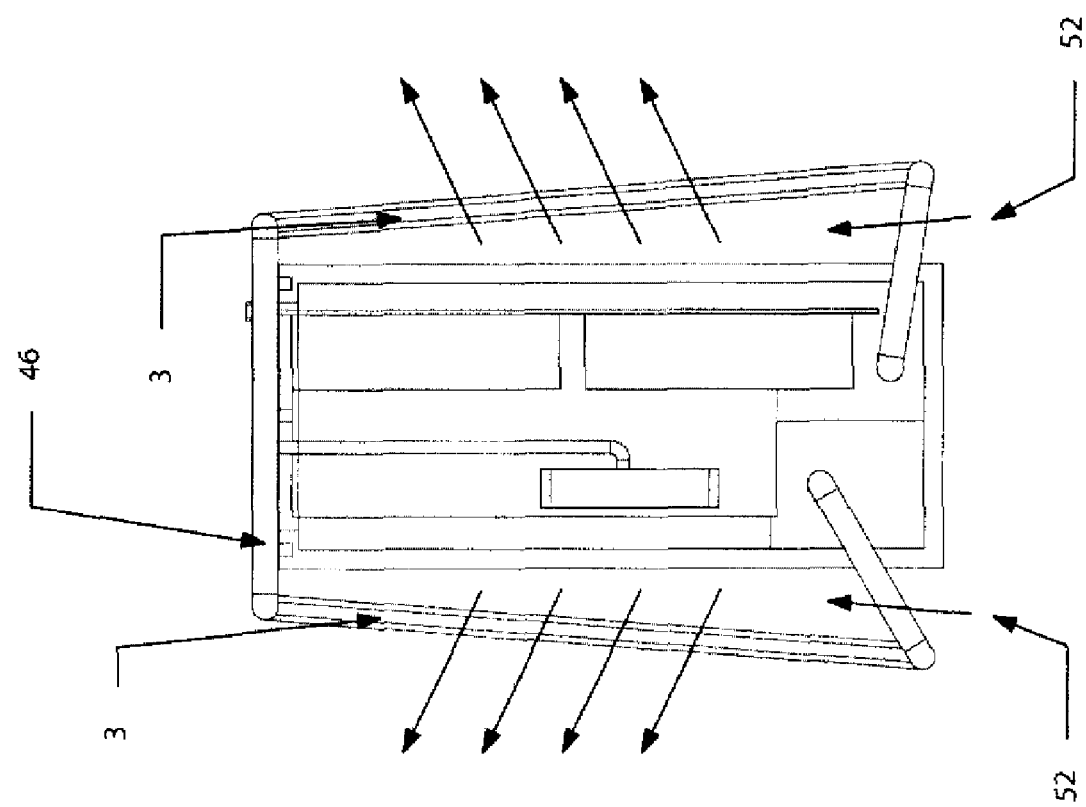
FIG. 14 is an end view similar to FIG. 12B showing how convection cooling works.

The computer system can be cooled via active or passive convection cooling, as shown in FIG. 14. Rather than forcing air from the front of the case to the back of the case, as seen in conventional designs, air is allowed to travel vertically. Heat rises, and the cooling system 22 design takes advantage of this, as described in the following steps.

1. Cool air from underneath the computer is drawn upward as shown by arrows 52.
2. The heat exchangers 3 are designed to allow the cool air to flow upward between the heat exchangers and the outside of the case 1. As heat is dissipated from the coolant inside the heat exchangers 3, the cooler air around the heat exchangers 3 is heated and rises.
3. The air flows through the heat exchangers 3 and is expelled at the sides and top of the system. This rising air helps to pull more cool air into the system, much like a cooling tower for a boiler.

Air flow may be aided by the use of an air-moving device or devices such as one or more fans mounted on the top or bottom of the cooling stack. However, for some applications only passive, convection-induced air flow may be required.

Figure 15:
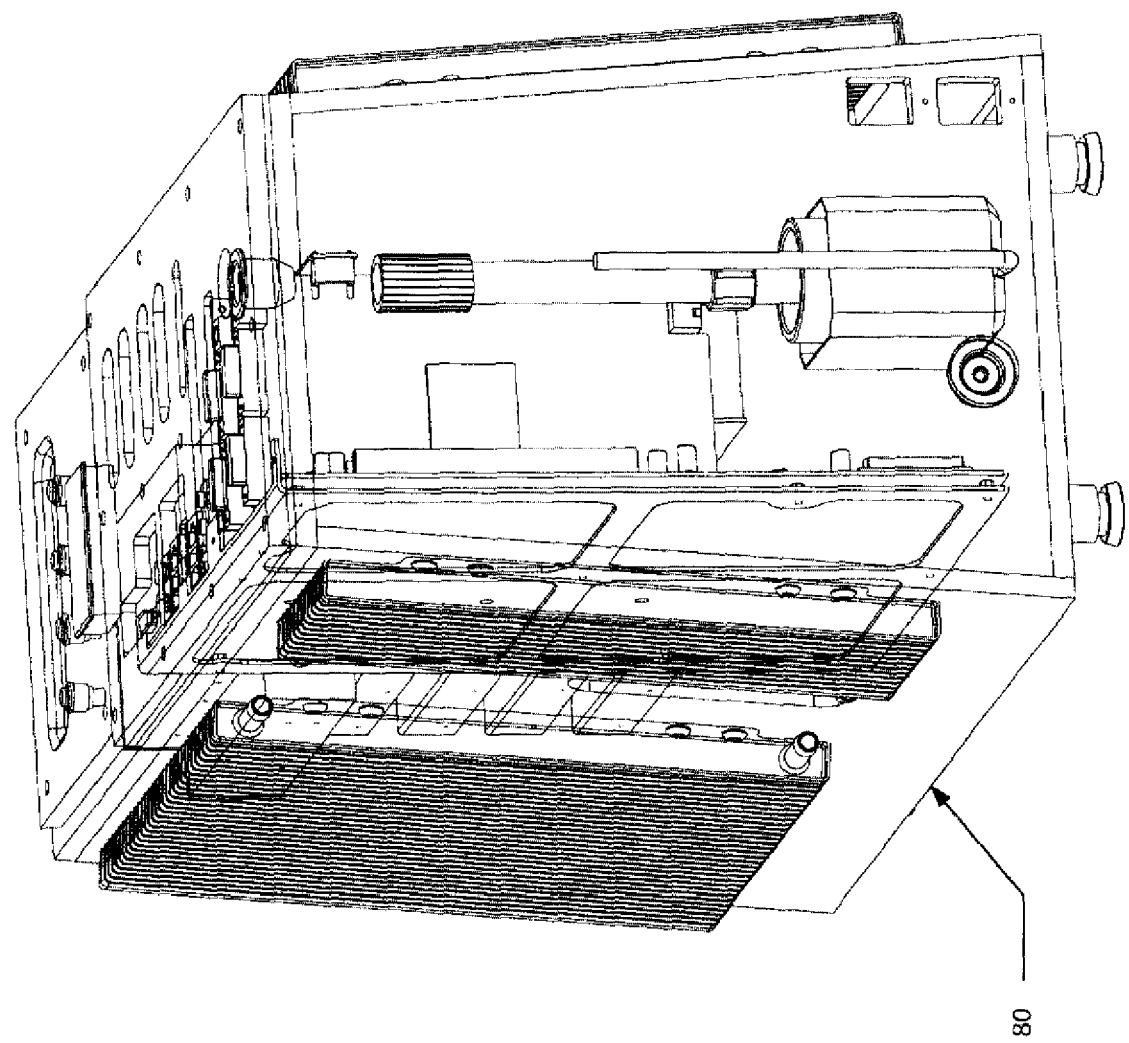
FIG. 15 is an illustration of a prototype computer that incorporates the liquid submersion cooling system, where the video boards and pump are visible in the case and the radiators are visible, mounted on the sides.
Figure 16:
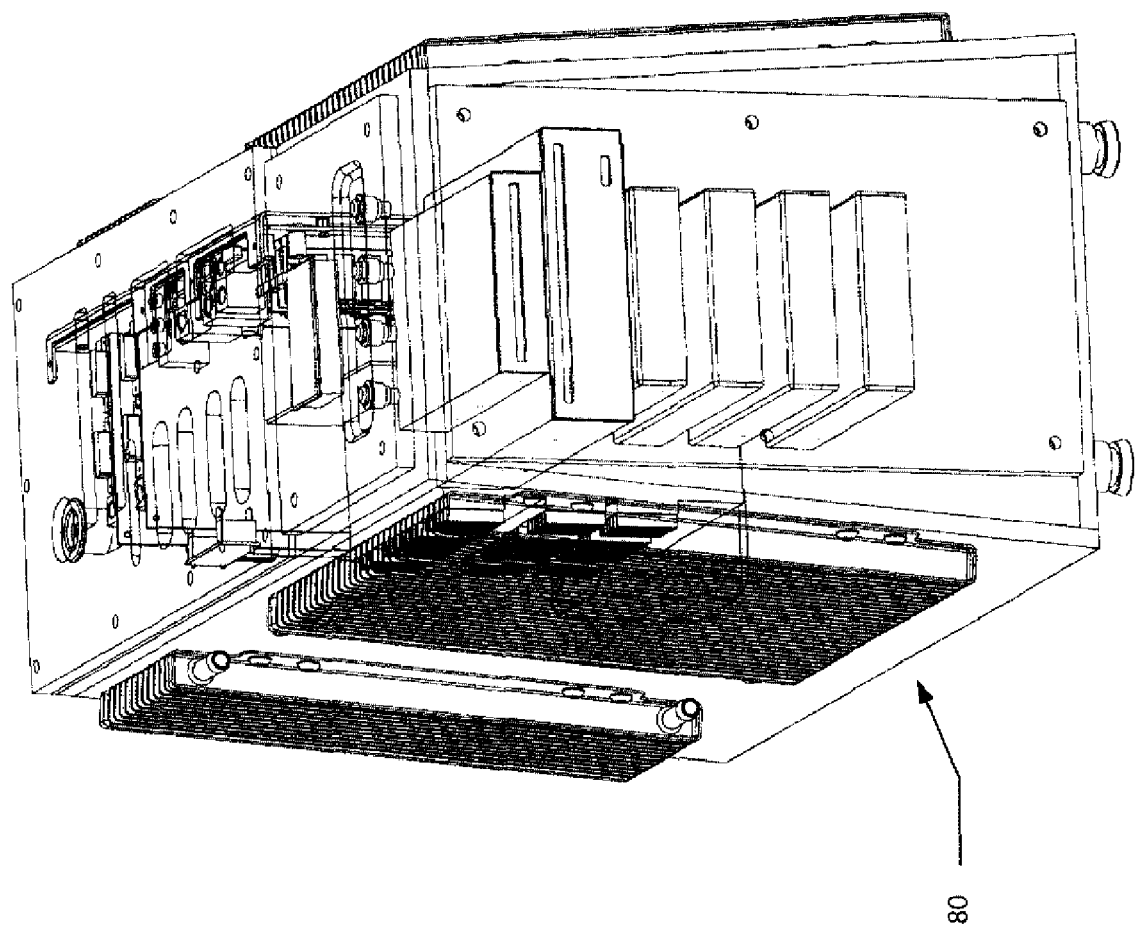
FIG. 16 is an illustration of the prototype computer of FIG. 15 showing the front and top of the case.

FIGS. 15-16 illustrate a prototype computer 80 that incorporates the liquid submersion cooling system 22. Due to the clear case, the video boards and pump are visible in the case and the heat exchangers are visible, mounted on the sides of the case.

Figure 19:
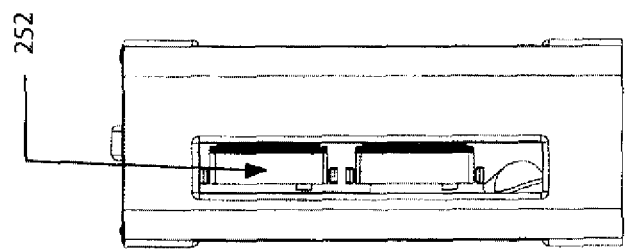
FIG. 19 is an end view of the computer shown in FIG. 17.
Figure 18:
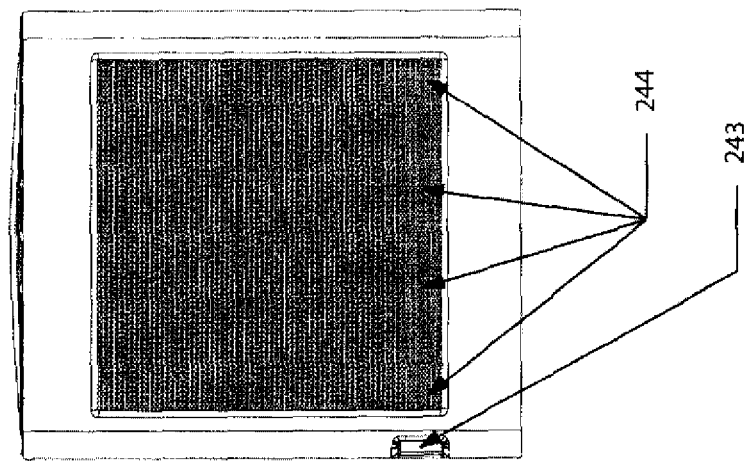
FIG. 18 is a side view of the computer shown in FIG. 17.
Figure 17:
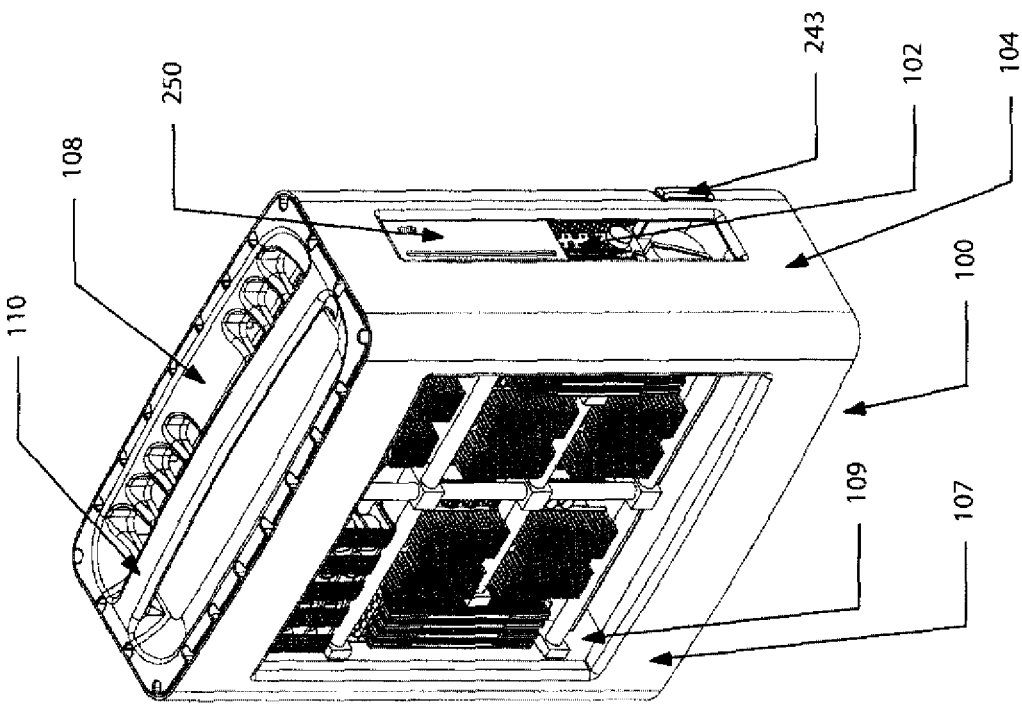
FIG. 17 is a perspective view of another embodiment of a liquid submersion cooling system on a personal computer.

FIGS. 17-19 illustrate another embodiment of a personal computer 100 employing an alternative liquid submersion cooling system 102. The computer 100 includes a case 104 that has a liquid-tight interior space 106 (FIG. 20) designed to be leak-proof so that it can be filled with a coolant liquid. As used herein, the word "case" is meant to include a housing, an enclosure, and the like. In the illustrated embodiment, the side wall 107 of the case defines at least one side of the interior space 106, and a portion 109 of the side wall 107 is made of translucent, preferably transparent, material to allow viewing inside the space 106. The material used for the portion 109 can be any material suitable for forming a leak-proof container and, if viewing of the internal computer components is desired, the material should be translucent or transparent. An example of a suitable material is a polycarbonate.

The case 104 also includes non-liquid tight space 111 next to the liquid-tight interior space 106 in which components of the computer 100 and the cooling system 102 are disposed as described below.

Figure 20:
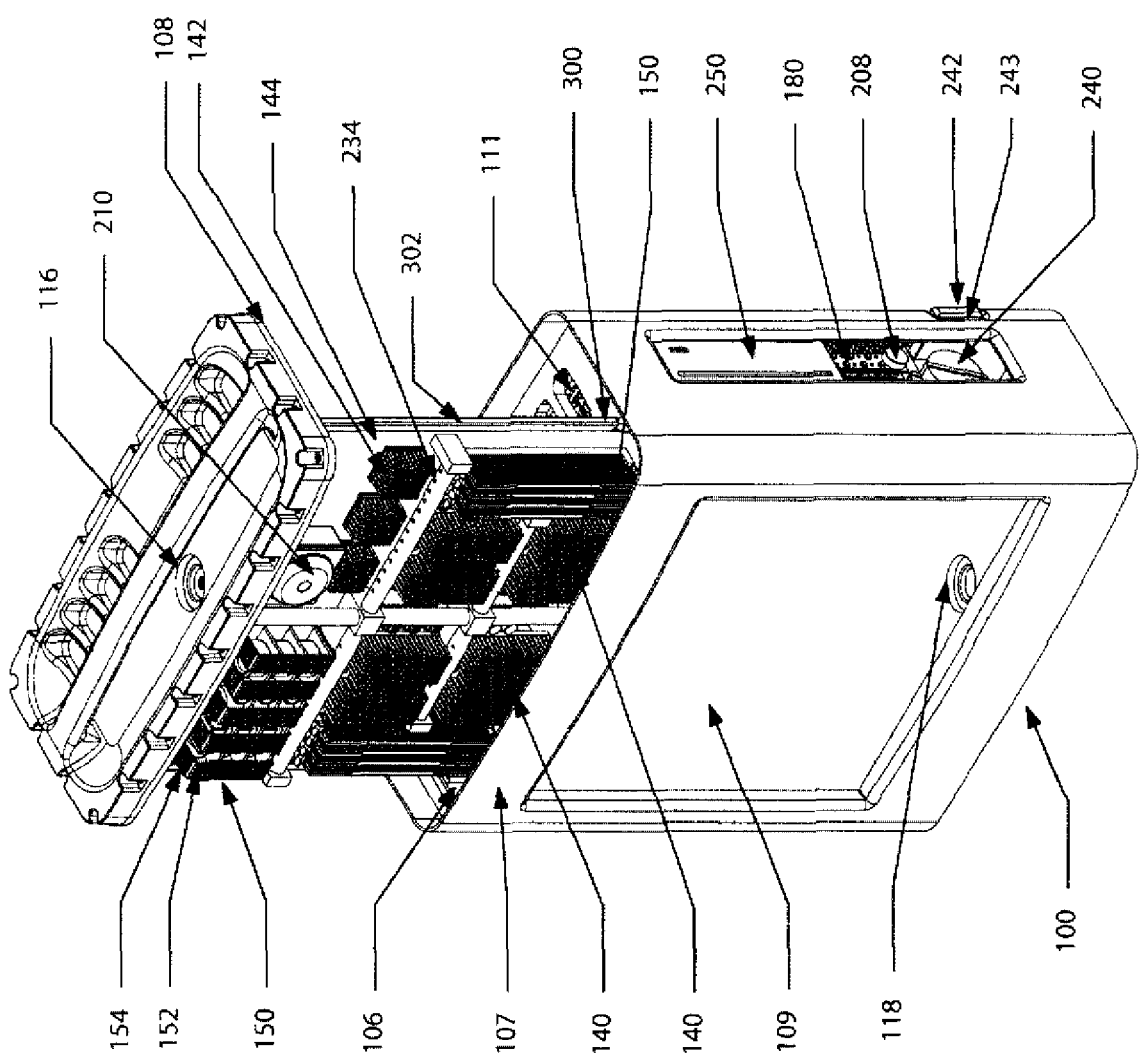
FIG. 20 is a perspective view similar to FIG. 17 but with the motherboard assembly partially lifted from the interior space.

With reference to FIGS. 17 and 20, the case 104 includes a lid 108 that closes the top of the case 104, but which can be removed to permit access to the spaces 106, 111. The lid 108 includes a seal 113 (shown in FIGS. 21 and 22) for forming a liquid-tight seal with the interior space 106 of the case when the lid 108 is in position closing the case. In addition, the lid 108 includes a handle 110 that facilitates grasping of the lid 108 and lifting of any internal computer components connected thereto out of the interior space 106. The lid 108 also includes a pass-through connector 112 (partially visible in FIG. 22), similar in function to the pass-through connector 7, to which a motherboard 114 assembly is connected, and which permits pass-through connections such as USB ports, video card connections, etc., through the lid 108 to the inside of the space 106 and to the outside of the space 106.

For safety, an AC current cut-off mechanism 115 is also provided, as shown in FIGS. 31A-C, such that when the lid 108 is opened, electrical power in the computer is shut off, preventing operation of any electrical components. For example, the mechanism 115 may be accomplished by routing AC power through a bridge board 400 that is contained in, or otherwise connected to, the lid 108. The board 400 is connected to the motherboard assembly 114 comprised of a motherboard 302 and a support 300 member.

The board 400 includes an AC power socket 402 for receiving AC power. A neutral line 404 and a ground line 406 leads from the power socket 402 to a pass-through connector 112 leading to the interior space 106. In addition, a hot or live wire 408 leads from the socket 402 to a second pass-through connector 112 leading to the space 111, passes under the board 400 and back to the top of the board 400 to a return portion 410 that connects to the pass through connector 112 to pass AC power into the interior space 106.

An external board 412, illustrated in FIG. 31C, is fixed in the space 111. The board 402 includes a u-shaped connector 414 at the top thereof, one end of which connects to the hot wire 408 and the other end of which connects to the return portion 410 when the lid 108 is in place.

When the case is opened by removing the lid 108, the hot wire 408 becomes disengaged from the connector 414 on the external board 412, opening the electrical circuit and disconnecting AC power from the interior space. The current cut-off mechanism 115 may also be accomplished by routing AC power through two pins on the bridge board 400. These pins would be shorted, passing current back to the external board 412. When the case is opened, the bridge board 400 becomes disengaged from the connector 414 on the external board 412.

The lid 108 also includes an opening 116 through which liquid can be added into the space 106. The opening 116 is closed by a removable cap which is removed when liquid is to be added. The lid 108 can also include a lock mechanism (not shown) that locks the lid in place.

With reference to FIG. 20, the case 104 can include a drain valve 118 (shown schematically) that can be opened in order to drain liquid from the case. The valve 118 can be any type of valve that can be opened and closed, preferably manually, for draining the case. The valve 118 is illustrated as being positioned at the bottom of the interior space at the bottom of the case 104. However, the valve can be positioned at any other suitable location on the case. The front portion of the case 104 can have a touch screen display that allows users to run the computer 100 from the front without plugging in a monitor.

Figure 22:
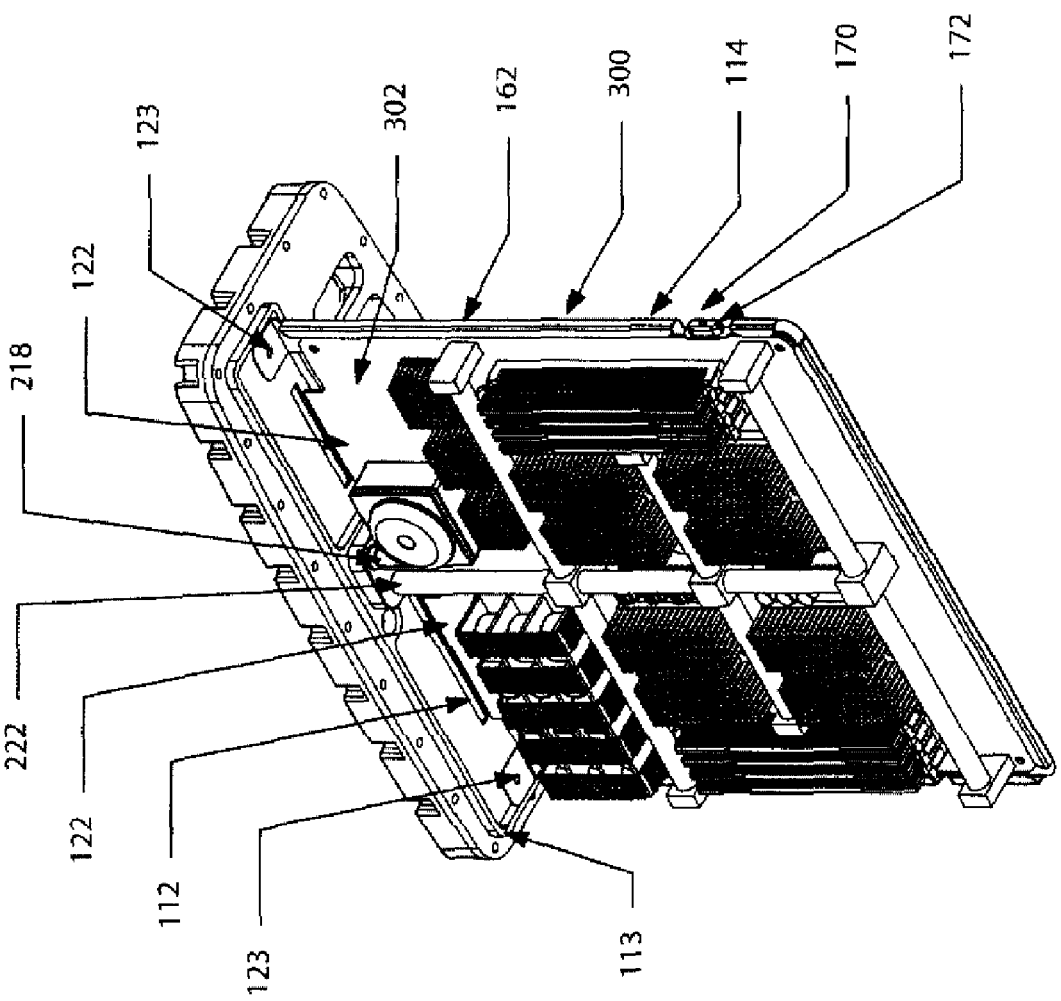
FIG. 22 is a perspective view of the motherboard assembly.
Figure 21:
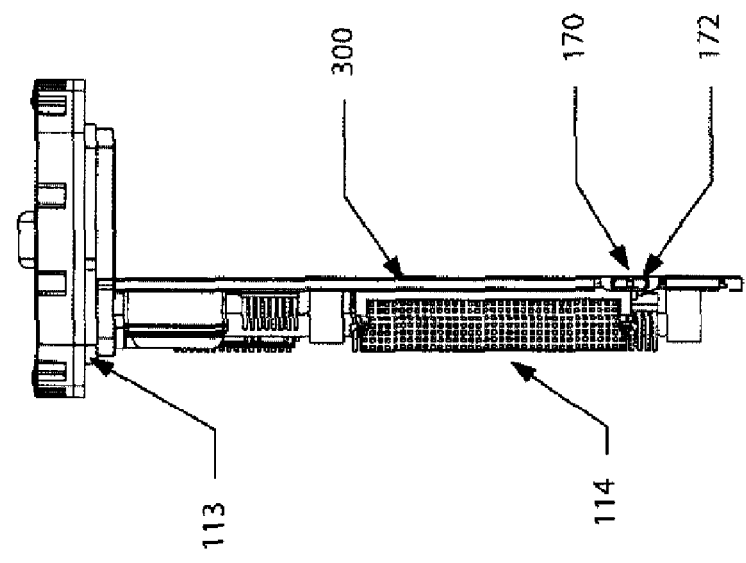
FIG. 21 is an end view of the motherboard assembly removed from the computer.

The motherboard assembly 114 acts as a support for many of the internal components of the computer 100. The motherboard assembly 114 is removable and disposed in the interior space 106 to permit the motherboard assembly to be lifted from the case when the lid 108 is lifted upward. With reference to FIGS. 20-22, the motherboard assembly 114 includes a support member 300 on which is disposed a motherboard 302 that supports the submerged components.

Figure 24:
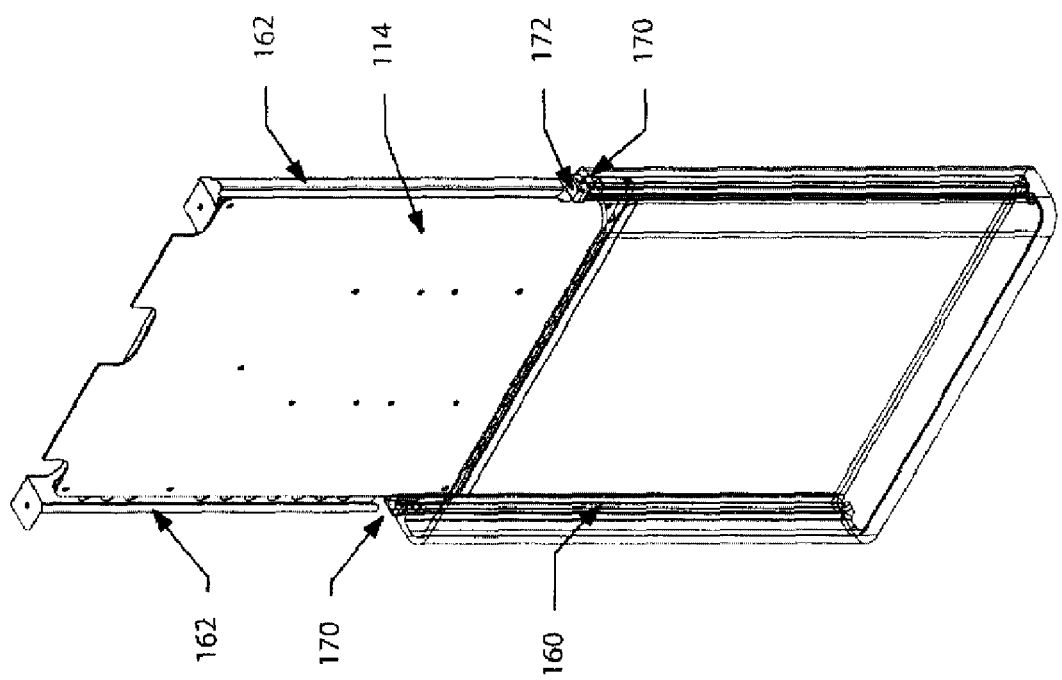
FIG. 24 illustrates the motherboard assembly in a raised position.

The motherboard assembly 114 is fixed to the lid 108 via flanges 122 at the top end of the motherboard 114, shown in FIG. 24, that connect to the pass-through connector 112. In addition, a pair of tabs 123 that are fixed to the support member 300 are connected to the lid 108.

Figure 23:
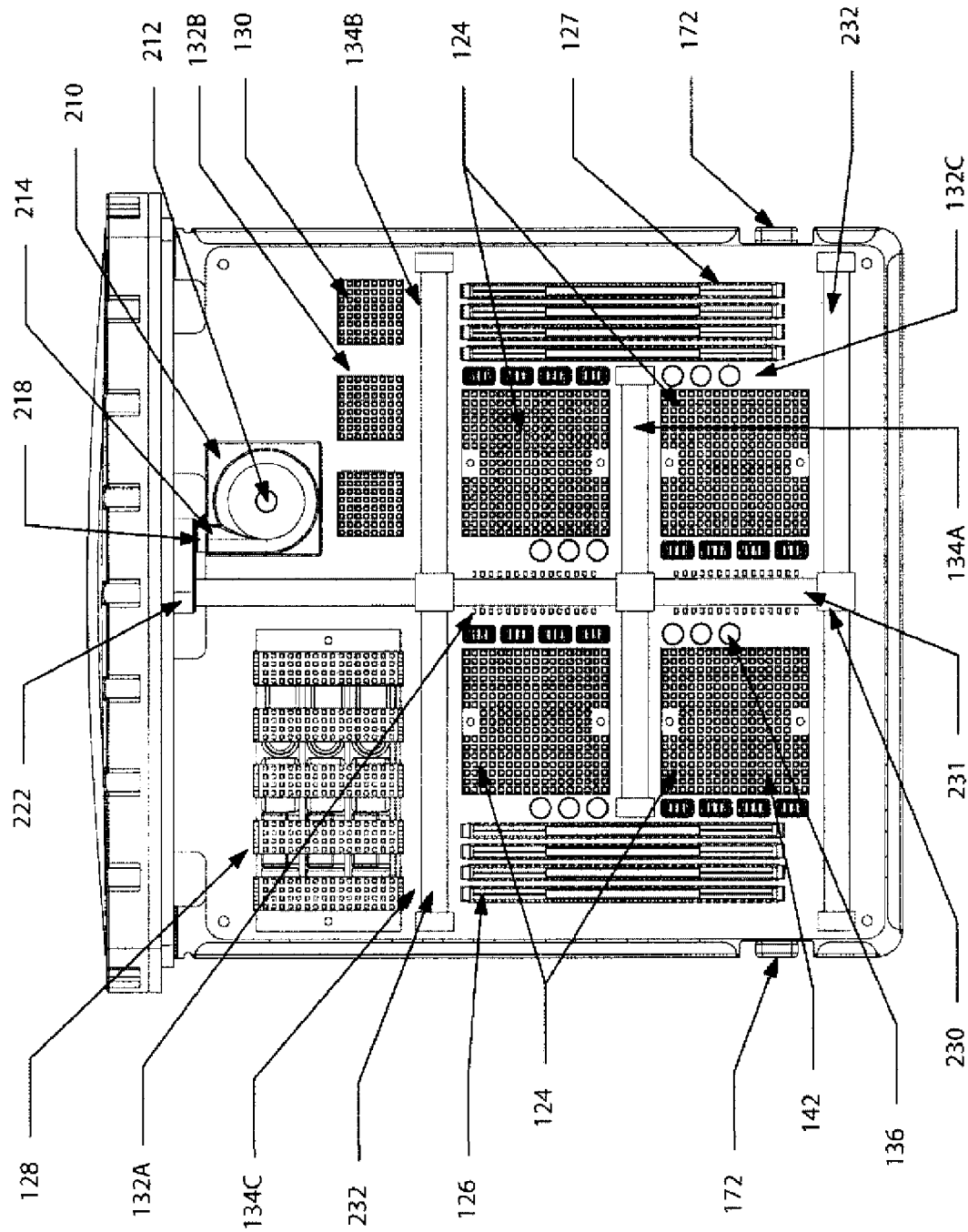
FIG. 23 is a side view of the motherboard assembly.

An exemplary layout of the motherboard components is illustrated in FIG. 23. The layout is designed to render the motherboard nearly or completely 302 wire-free and facilitate movement of cooling liquid in the interior space 106. The motherboard 302 is illustrated as having mounted thereto four CPUs and/or GPUs 124, video/motherboard memory cards 126, memory cards 127, power supply 128, and controller chips 130. These components are laid out relative to each other to define a number of vertical and horizontal liquid flow channels that aid in the flow of liquid. For example, vertical channels include channel 132A between the CPUs/GPUs 124, channels 132B between the controller chips 130, and channels 132C between the CPUs/GPUs and the memory cards 126, 127. Horizontal channels include, for example, channel 134A between the CPUs/GPUs, channel 134B between the CPUs/GPUs and the controller chips 130, and channel 134C between the CPUs/GPUs and the power supply 128. A plurality of sets of light-emitting diodes (LEDs) 136, that can produce a desired color/wavelength of light, such as ultraviolet, can also be mounted to the motherboard 114 at dispersed locations. When illuminated, the LEDs 136 give the liquid in the interior space 106 a luminescent glow.

To help dissipate heat, heat sinks can be affixed to some or all of the heat-generating components on the motherboard 302. The use of heat sinks will depend on the amount of heat generated by a particular component and whether it is determined that additional heat dissipation than that provided by direct contact with the liquid is necessary for a particular component.

As shown in FIGS. 20-23, heat sinks 140 are shown attached to the CPUs/GPUs 124 and the controller chips 130. The heat sinks 140 each comprise a plurality of elongated fins 142 that extend from a base plate 144 fixed to the component. The fins 142 and plate 144 conduct heat away from the component. In addition, the fins 142 define flow channels therebetween that allow the cooling liquid to flow through and past the plurality of fins to transfer heat to the liquid.

Heat sinks 150 are also attached to the memory cards 126, 127 and the power supply 128. The heat sinks 150 are similar to the heat sinks 140, including fins 152 connected to a base plate 154 fixed to the component. However, the fins 152 are short, having an axial length significantly less than the fins 142. Nonetheless, the fins 152 define flow channels therebetween which allow the cooling liquid to flow through and past the plurality of fins to transfer heat to the liquid.

As described above, the motherboard assembly 114 is removable and disposed in the interior space 106 to permit the motherboard assembly to be lifted from the space when the lid 108 is lifted upward. With reference to FIG. 24, the interior space 106 of the case 104 includes a pair of channels 160 at opposite ends of the walls that define the interior space. Each channel 160 extends from the top of the walls to the bottom, and are continuous from top to bottom. As shown in FIGS. 22 and 24, the side edges of the motherboard assembly are provided with slides 162 that are sized and configured to slide within the channels 160. The channels 160 and the slides 162 help guide the motherboard assembly 114 when it is lifted upward from the case and when it is lowered back into the interior space.

With reference to FIGS. 21-24, one or more slide locking mechanisms 170 can be provided to retain the motherboard assembly 114 at a raised position outside the interior space 106. Two slide locking mechanisms 170 are illustrated. However, a single slide locking mechanism could be used if found sufficient to retain the motherboard assembly at the raised position. By keeping the motherboard assembly raised, maintenance and/or replacement of motherboard components is facilitated, while also allowing liquid to drain down into the interior space 106 when the assembly 114 is lifted upward.

The slide locking mechanisms 170 can have a number of configurations. The illustrated embodiment is shown to include a stop member 172 that forms part of the slide 162. The stop member 172 is pivotally connected to the motherboard assembly so that it can rotate between the position shown in FIGS. 21-23 and the position shown in FIG. 24. The stop member 172 is biased by a spring (not shown) to bias the stop member in a counterclockwise direction (when viewing FIG. 21) so that when the motherboard assembly is lifted upward, the stop member(s) automatically rotate to the position shown in FIG. 24 when the stop members 172 clear the channels 160.

At the position shown in FIG. 24, the stop member 172 is prevented from further rotation in the counterclockwise direction to prevent the motherboard assembly from falling back down into the interior space 106 due to interference between the stop member(s) 172 and the structure forming the channels 160. To release the slide locking mechanisms 170, the motherboard assembly is lifted further upward, and the stop member(s) manually rotated in a clockwise direction to the position shown in FIGS. 21-23. The assembly is then lowered down into the case.

With reference to FIGS. 17 and 20, the submersion cooling system 102 includes a heat exchanger 180 mounted in the space 111 within the case 104, a pump 210 mounted on the motherboard 302 inside the interior space 106, and a dielectric cooling liquid within the interior space 106. The interior space should contain enough dielectric cooling liquid to submerge the components that one wishes to be submerged. For example, the cooling liquid may substantially fill the interior space 106, whereby all heat-generating components on the motherboard are submerged. The cooling system 102 is designed to direct heated dielectric liquid from inside the space 106 and into the heat exchanger 180 outside the space 106 where the liquid is cooled. The cooled liquid is then returned to the space 106.

Figure 26:
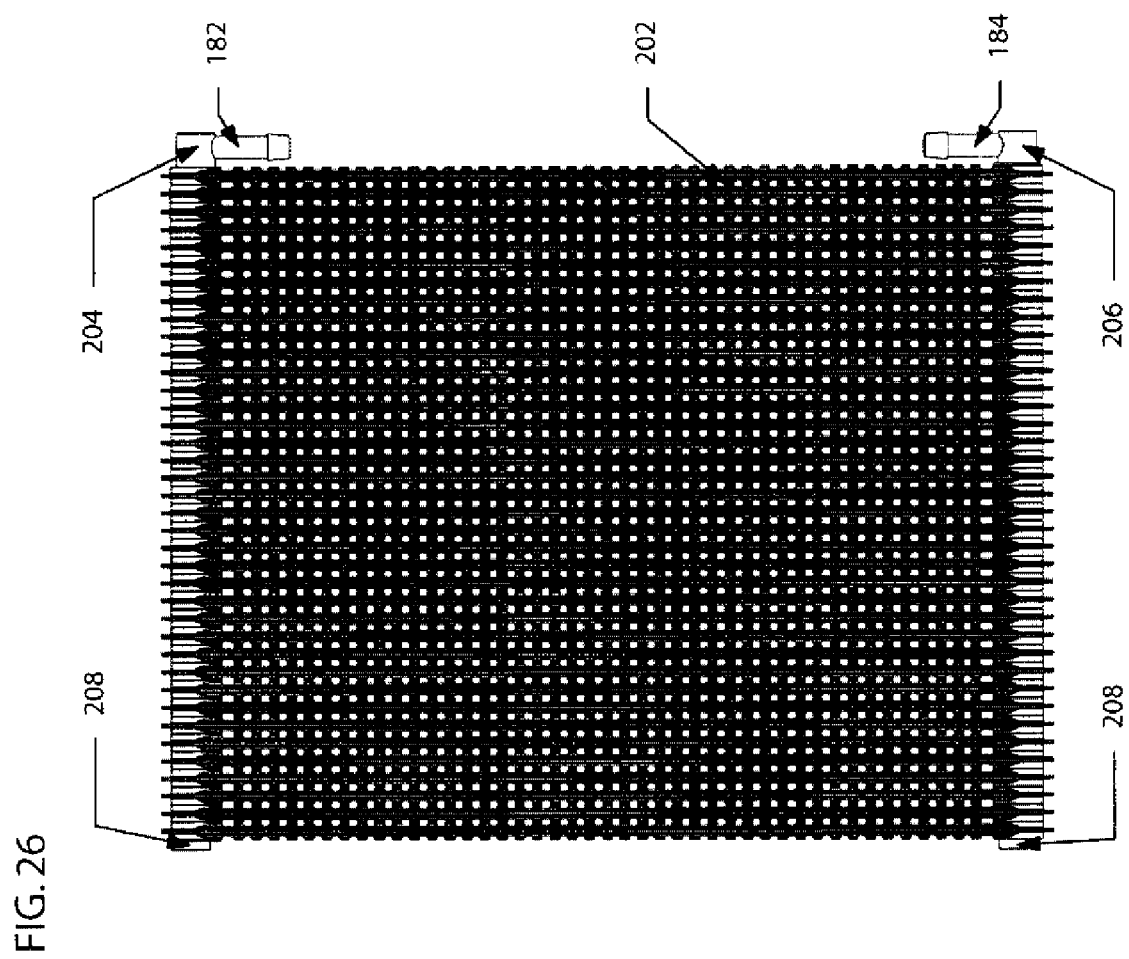
FIG. 26 is a side view of the heat exchanger.

The heat exchanger 180 is positioned outside of the space and substantially forms an outer wall of the computer 100 as shown in FIG. 18. The heat exchanger 180 is configured to allow passage therethrough of the liquid for cooling. In the illustrated embodiment, the heat exchanger 180 is of a size to form substantially one wall of the case 104. With reference to FIG. 26, the heat exchanger 180 includes an inlet 182 through which cooling liquid enters, an outlet 184 through which cooling liquid exits, and at least one flow path for cooling liquid through the heat exchanger extending from the inlet 182 to the outlet 184.

Figure 27:
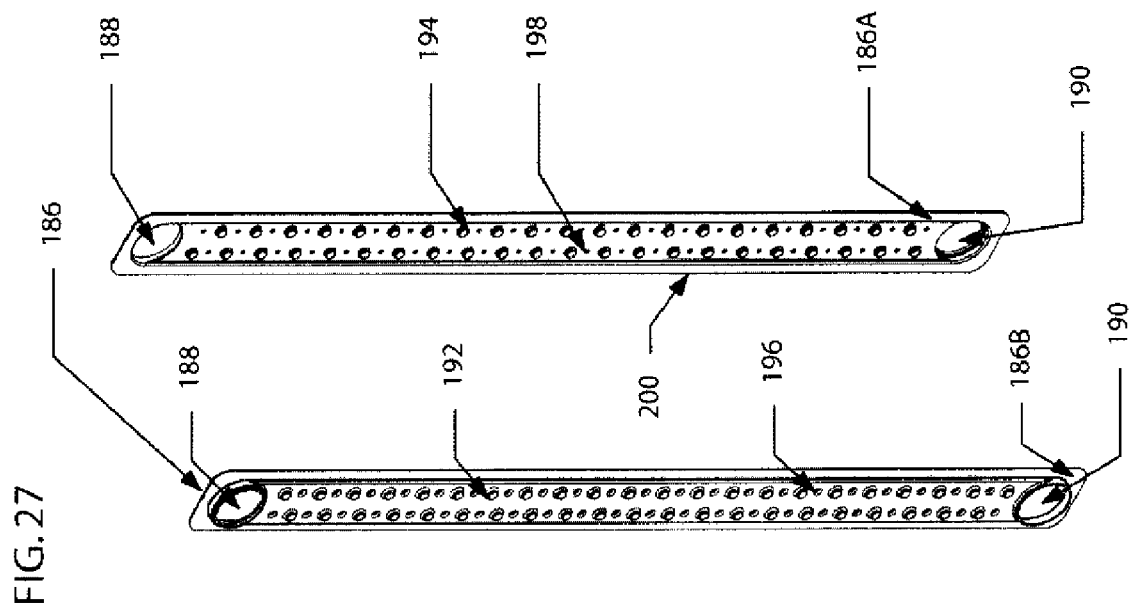
FIG. 27 illustrates a pair of heat exchanger plates used to form the heat exchanger.

The heat exchanger 180 can take on a number of different configurations, as long as it is able to cool the liquid down to an acceptable temperature prior to being fed back into the space 106. An exemplary configuration of the heat exchanger 180 is shown in FIGS. 26 and 27. In this embodiment, the heat exchanger 180 comprises a plurality of identical plates 186 that are connected together. Each plate 186 includes a hole 188, 190 at each end that during use form plenums that receive the dielectric liquid. The plate 186 also includes a first plurality of holes 192 defined by bosses that extend in one direction, and a second plurality of holes 194 defined by bosses that extend in the opposite direction. The holes 188, 190 are also defined by bosses that extend in the same direction as the bosses defining the holes 192. In addition, a central portion 196 of the plate 186 is bulged in the direction of the bosses of the holes 188, 190, 192, so that the opposite side of the plate 186 is recessed 198 below a surrounding rim 200.

To form the heat exchanger 180, a first plate 186A is flipped over as shown in FIG. 27, and the two plates 186A, 186B then secured together such as by soldering along the rim 200. The two holes 188 are aligned at the top, and the two holes 190 are aligned at the bottom. In addition, the bosses that define the holes 194 engage with each other to form a number of air passages between the two plates 186A, 186B. The recesses 198 allow liquid to flow downward from the holes 188, past the engaged bosses of the holes 194, and down to the holes 190.

A third plate 186 is then connected to one of the plates 186A, 186B, with the third plate being flipped over relative to the plate to which it is connected. The bosses that define the holes 188, 190 will engage each other, as will the bosses that define the holes 192. This will create a series of air flow paths 202 on the outside of the heat exchanger as shown in FIG. 26. This process of adding plates 186 is repeated to create the size of heat exchanger needed. For the two plates at opposite ends of the heat exchanger 180, the holes 192, 194 will be closed off to prevent escape of liquid. In addition, an inlet fitting 204 defining the inlet 182 will be connected to the boss defining the opening 188, while an outlet fitting 206 defining the outlet 184 will be connected to the boss defining the opening 190. At the opposite end of the heat exchanger, the openings 188, 190 are closed by suitable caps 208.

In use of the heat exchanger 180, liquid to be cooled flows into the inlet 182 and into the plenum at the top of the heat exchanger defined by the holes 188. The liquid is able to flow downward in the recesses 198 past the bosses of the holes 194. As it does, the liquid transfers heat to the bosses. At the same time, air can flow into the aligned bosses of the holes 194 to pick up heat. Air also flows into the flow paths 202 for additional heat exchange with the bulged central portion 196. The cooled liquid collects in the plenum defined by the aligned holes 190, and is pumped through the outlet 184 and back into the space 106 by the pump 210.

Referring to FIGS. 20, 22 and 23, the pump 210 is mounted on the motherboard 302 and in use is submerged in the dielectric liquid. The pump 210 is sized to be able to circulate liquid to outside the space, through the heat exchanger, and back into the space. The pump 210 is illustrated as a centrifugal pump having an inlet 212 and an outlet 214. The inlet 212 receives liquid therethrough from the space 106, and pumps it through the outlet 214 connected to an outlet port 218 formed on the lid 108. The outlet port 218 extends through the lid 108 and is fluidly connected to the heat exchanger inlet 182 by suitable tubing. The heat exchanger outlet 184 is fluidly connected by suitable tubing to an inlet port 222 formed through the lid to direct liquid back into the space 106.

In areas where there is significant heat, direct impingement cooling can be used to provide localized cooling. In particular, as shown in FIGS. 20, 22, and 23, a spray bar assembly 230 is connected to the inlet port 222. The spray bar assembly 230 includes a central passageway 231 extending along the vertical channel 132A, and plurality of branches or vents 232 that extend along the horizontal channels 134A-C (and at the bottom of the space 106). The branches 232 include holes 234 (FIG. 20) to direct cooled liquid directly onto the components 124, 126, 127, 128, 130. The holes 234 are in the top of the branches 232 to direct liquid upwardly. However, holes could also be provided at the bottom of the branches to directed liquid downwardly onto the components.

Figure 25:
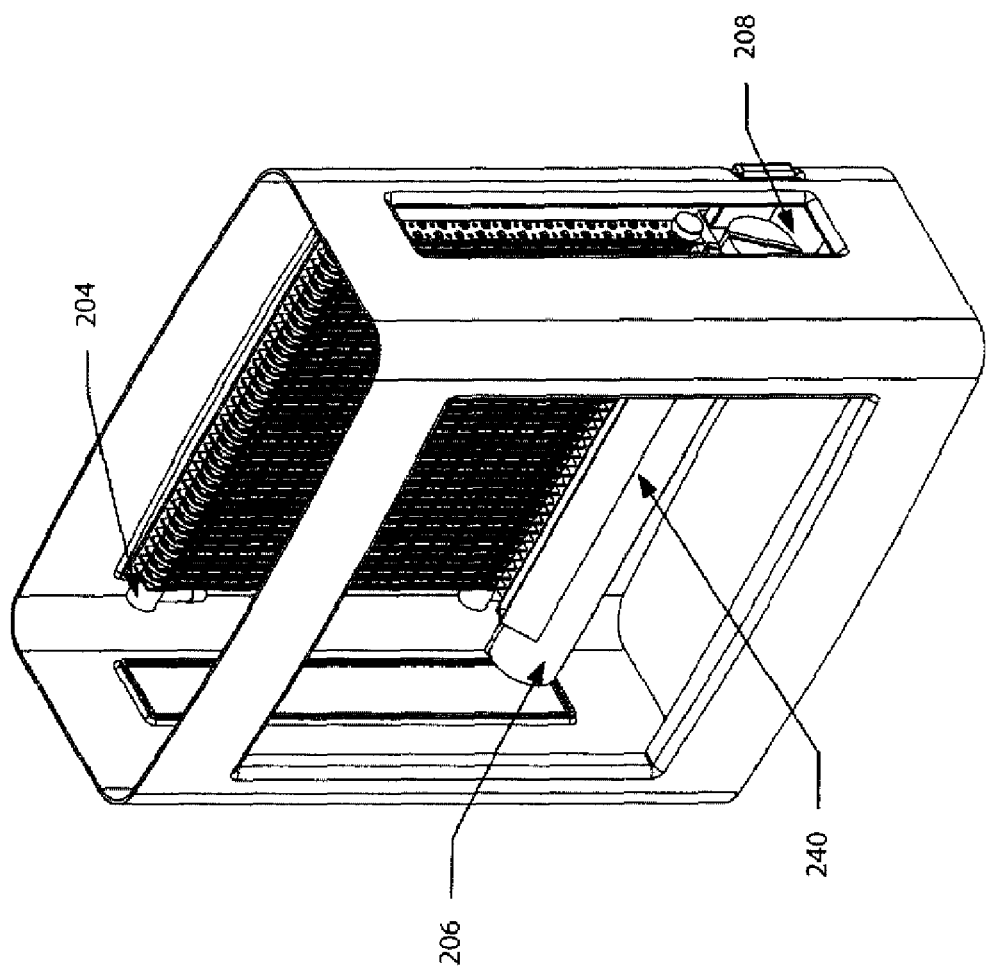
FIG. 25 is a perspective view of the computer case with the motherboard assembly and lid removed.
Figure 28:
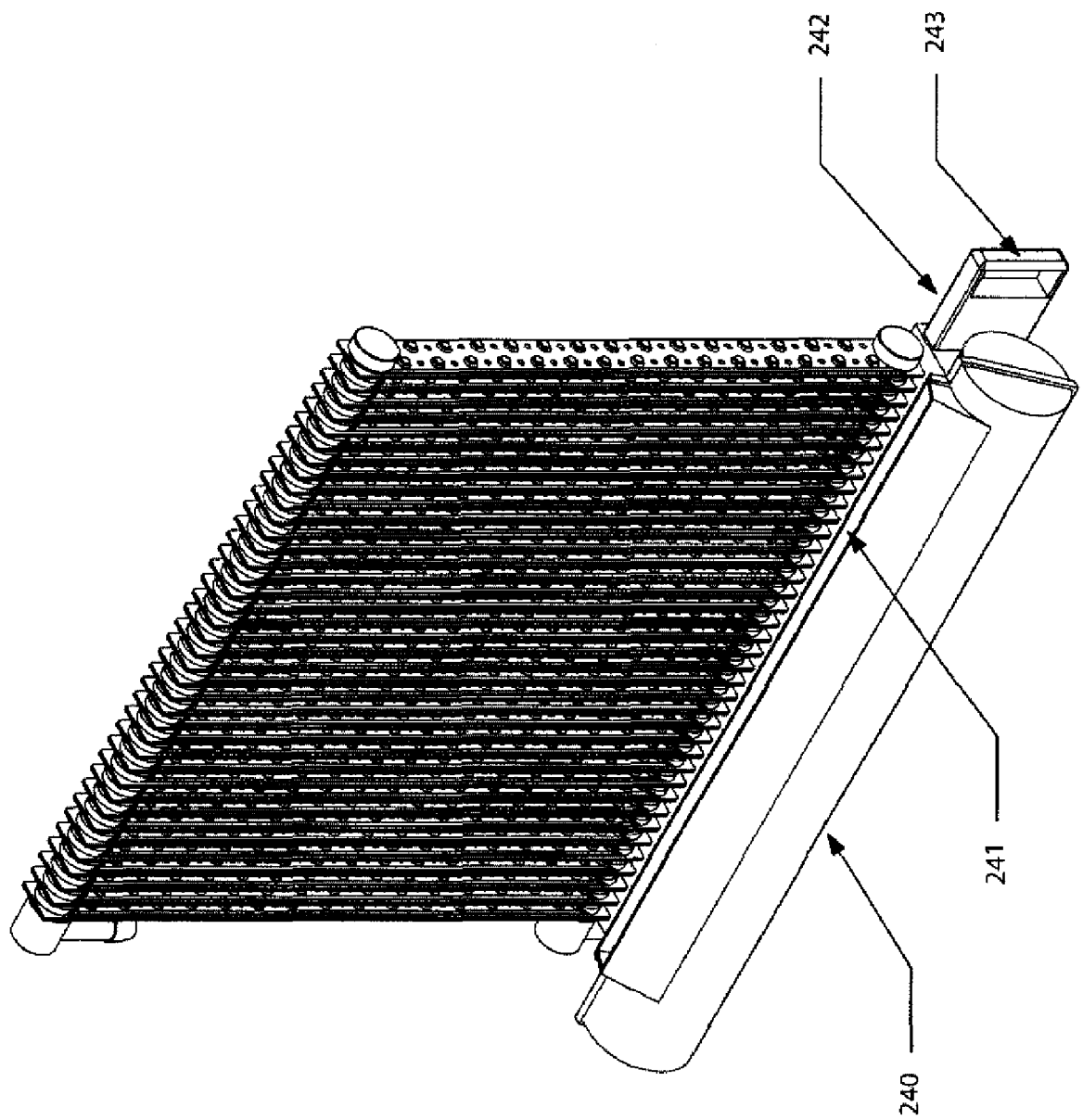
FIG. 28 is a perspective view of the heat exchanger and fan.
Figure 30A:
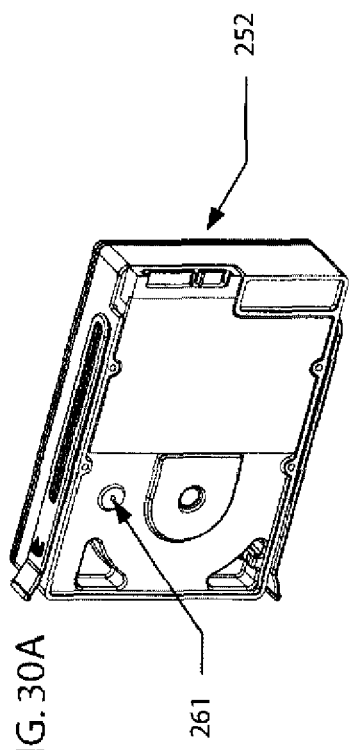
FIGS. 30A, 30B, and 30C illustrate use of the snorkel attachment on a hard drive.
Figure 30B:
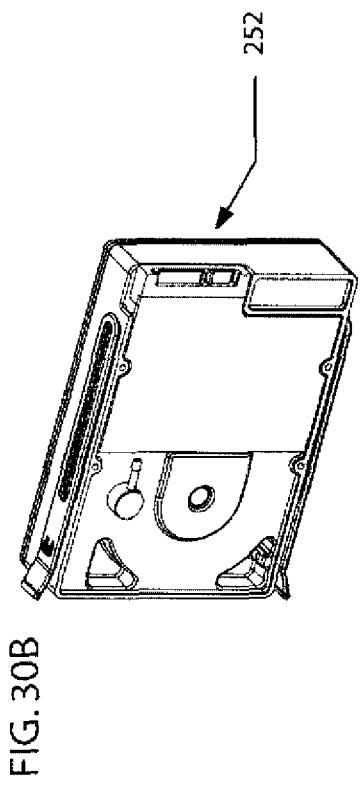
Figure 30C:
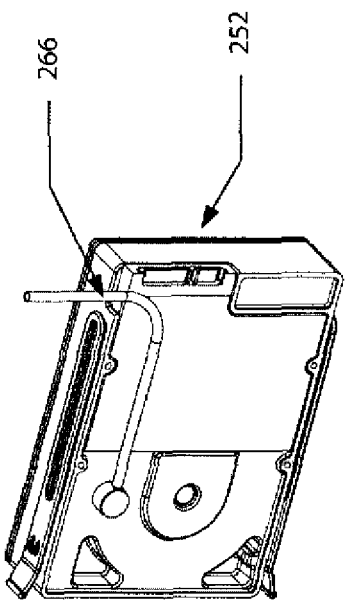
Figure 29:
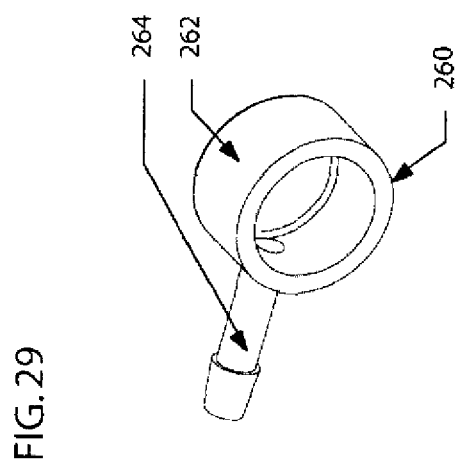
FIG. 29 illustrates a snorkel attachment for use with a hard drive.

An air-moving device can be provided to create a flow of air past the heat exchanger. A number of different air-moving devices can be used, for example, a fan or an ionization device. The drawings illustrate the use of a fan 240 to create air movement past the heat exchanger 180. The fan 240 is best seen in FIGS. 20, 25, and 28. The fan 240 is positioned at the bottom of the computer 100 at the base of the heat exchanger 180. In the illustrated embodiment, the fan is a squirrel-cage type fan with an air outlet 241 that extends substantially across the entire length of the heat exchanger in order to create air flow across the entire heat exchanger. An air filter 242 is located in front of the inlet of the fan 240 in order to filter the air. The air filter 242 can be any suitable type of air filter, for example, a high-efficiency particulate air (HEPA) filter. The filter 242 is mounted so as it is able to slide and be removable from the case 104 by pulling on a handle 243. This permits the filter 242 to be cleaned or replaceable with a replacement filter. Air is drawn into the filter and the fan via a series of air vents 244 (FIG. 18) on the side of the computer.

The computer 100 can also include additional features, such as a drive mechanism 250 external to the case 104. The drive mechanism 250 can be a DVD drive, a floppy drive, a CD drive, a Blu-ray drive, HD drive, and the like. In addition, one or more hard drives 252 are accessible from the opposite side of the case 104. The hard drives 252 can be mounted so as to permit easy replacement with replacement hard drives.

In some embodiments, the hard drive 252 may be disposed within the interior space 106 of the case, submerged in the dielectric liquid. In these embodiments, it is necessary to equalize air pressure within the hard drive and the exterior of the space 106. FIGS. 29 and 30A-C illustrate a snorkel attachment 260 that can be connected to a breather hole 261 (see FIG. 30A) on a hard drive to aid in achieving the pressure equilibrium. The snorkel attachment 260 includes a circular cap 262 that is designed to fit around the breather hole 261 (see FIG. 30B) and form a liquid tight seal with the hard drive 252 to prevent entry of liquid. A fitting 264 extends from the cap 262, and a breather conduit 266 connects to the fitting 264. The breather conduit 266 can be directed to the outside of the space 106, or the conduit 266 can connect to a fitting extending through the lid 108. The snorkel attachment 260 permits achievement of pressure equilibrium between the hard drive and outside air pressure, allowing the hard drive to function properly while submerged in the dielectric liquid.

The dielectric liquid that is used in the computer 100 can be any of the dielectric liquids discussed above. In addition, a soy-based dielectric liquid can be used. If desired, a colorant material can be added to the dielectric liquid to make the liquid a particular color. Because the portion 109 of the side wall 107 is clear, adding a colorant to the liquid will change the visual impact of the computer.

The invention claimed is:

1. A liquid submersion cooled computer, comprising:
   a case having a liquid-tight interior space;
   a lid removably connected to the case for closing a top of the interior space, the lid including at least one pass-through connector;
   a motherboard disposed in the interior space and attached to the lid, the motherboard having a top end with electrical contacts engaged with the pass-through connector that permits inputs/outputs and/or power to be passed to the motherboard;
   a plurality of components mounted on the motherboard, including one or more of a plurality of processors, a plurality of memory cards, a plurality of graphics cards, and a plurality of power supplies;
   a dielectric cooling liquid within the interior space and submerging at least one of the components on the motherboard so as to be in direct contact therewith; and
   an impingement cooling system that includes a plurality of tubes for directing a flow of the dielectric cooling liquid directly onto two or more of the plurality of components.

2. The liquid submersion cooled computer of claim 1, further comprising a liquid pump disposed in the interior space.

3. The liquid submersion cooled computer of claim 2, wherein the liquid pump is mounted on the motherboard.

4. The liquid submersion cooled computer of claim 1, comprising a plurality of processors, a plurality of memory cards, a plurality of graphics cards, and a plurality of power supplies mounted on the motherboard.

5. The liquid submersion cooled computer of claim 1, further comprising a heat sink connected to at least one of the components mounted on the motherboard, the heat sink including a plurality of fins that extend from a base plate, the fins defining liquid flow channels therebetween.

6. The liquid submersion cooled computer of claim 5, wherein the fins extend in a direction generally perpendicular to the motherboard.

7. The liquid submersion cooled computer of claim 1, further comprising light-emitting diodes mounted on the motherboard.

* * * * *